(12) United States Patent
Karakulak et al.

(10) Patent No.: US 9,905,302 B2
(45) Date of Patent: *Feb. 27, 2018

(54) READ LEVEL GROUPING ALGORITHMS FOR INCREASED FLASH PERFORMANCE

(71) Applicant: Western Digital Technologies, Inc., San Jose, CA (US)

(72) Inventors: Seyhan Karakulak, San Diego, CA (US); Anthony Dwayne Weathers, San Diego, CA (US); Richard David Barndt, San Diego, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/549,532

(22) Filed: Nov. 20, 2014

(65) Prior Publication Data
US 2016/0148701 A1    May 26, 2016

(51) Int. Cl.
| | | |
|---|---|---|
| *G11C 16/04* | (2006.01) | |
| *G11C 16/26* | (2006.01) | |
| *G11C 16/34* | (2006.01) | |
| *G11C 11/56* | (2006.01) | |

(52) U.S. Cl.
CPC .......... *G11C 16/26* (2013.01); *G11C 11/5642* (2013.01); *G11C 16/3427* (2013.01)

(58) Field of Classification Search
CPC ......... G11C 16/08; G11C 16/10; G11C 16/16; G11C 16/30
USPC ............................. 365/185.18, 185.11, 185.33
See application file for complete search history.

(56) References Cited

U.S. PATENT DOCUMENTS

| | | |
|---|---|---|
| 7,352,627 B2 | 4/2008 | Cohen |
| 7,480,829 B2 | 1/2009 | Dickenson et al. |
| 7,817,467 B2 | 10/2010 | Roohparvar et al. |
| 7,889,563 B2 | 2/2011 | Cho et al. |
| 7,890,818 B2 | 2/2011 | Kong et al. |

(Continued)

FOREIGN PATENT DOCUMENTS

| | | |
|---|---|---|
| KR | 2012-0069118 A | 6/2012 |
| KR | 2014-0071779 A | 6/2014 |

(Continued)

OTHER PUBLICATIONS

Chen, et al., "Increasing Flash Memory Lifetime by Dynamic Voltage Allocation for Constant Mutual Information," Mar. 2014, retrieved from <http://ita.ucsd.edu/workshop/14/files/paper/paper_293.pdf>.

(Continued)

*Primary Examiner* — Huan Hoang
(74) *Attorney, Agent, or Firm* — McDermott Will & Emery LLP

(57) ABSTRACT

A plurality of flash memory wordlines of a flash storage device are divided into a plurality of wordline groups based on read error counts associated with the wordlines and a plurality of read level offsets. Each wordline group is associated with one of a plurality of read level offsets determined while dividing the plurality of flash memory wordlines, and associations between the plurality of read level offsets and the plurality of wordline groups are stored for use in connection with read levels to read the flash memory wordlines of the respective wordline groups.

24 Claims, 16 Drawing Sheets

(56) References Cited

U.S. PATENT DOCUMENTS

| | | | |
|---|---|---|---|
| 8,072,805 B2 | 12/2011 | Chou et al. | |
| 8,140,739 B2 | 3/2012 | Langlois et al. | |
| 8,363,477 B2 | 1/2013 | Tsai et al. | |
| 8,406,053 B1 | 3/2013 | Dutta et al. | |
| 8,503,230 B2 | 8/2013 | Yoo et al. | |
| 8,630,121 B2 | 1/2014 | Yang | |
| 8,635,509 B2 | 1/2014 | Choi et al. | |
| 8,644,099 B2 | 2/2014 | Cometti et al. | |
| 8,693,257 B2 | 4/2014 | Sridharan et al. | |
| 8,737,133 B2 | 5/2014 | Sridharan et al. | |
| 8,737,136 B2 | 5/2014 | Cometti | |
| 8,879,324 B2 | 11/2014 | Alhussien et al. | |
| 9,576,671 B2 * | 2/2017 | Karakulak et al. | G11C 16/26 |
| 2006/0114722 A1 * | 6/2006 | Yokoi | G11C 11/5621 365/185.18 |
| 2008/0159007 A1 | 7/2008 | Sekar et al. | |
| 2010/0118608 A1 | 5/2010 | Song et al. | |
| 2010/0332729 A1 | 12/2010 | Alrod et al. | |
| 2012/0140560 A1 | 6/2012 | Yang | |
| 2012/0236641 A1 | 9/2012 | Hu | |
| 2012/0239991 A1 | 9/2012 | Melik-Martirosian | |
| 2013/0176784 A1 | 7/2013 | Cometti et al. | |
| 2013/0227200 A1 | 8/2013 | Cometti et al. | |
| 2013/0290612 A1 | 10/2013 | Weathers et al. | |
| 2013/0318422 A1 | 11/2013 | Weathers et al. | |
| 2014/0029336 A1 | 1/2014 | Venkitachalam et al. | |
| 2014/0029355 A1 | 1/2014 | Choi et al. | |
| 2014/0063940 A1 | 3/2014 | Chen et al. | |
| 2014/0101519 A1 | 4/2014 | Lee et al. | |
| 2014/0119124 A1 | 5/2014 | Kim et al. | |
| 2014/0169101 A1 * | 6/2014 | Choi | G11C 7/04 365/185.18 |
| 2014/0359202 A1 | 12/2014 | Sun et al. | |
| 2015/0070988 A1 | 3/2015 | Park | |
| 2015/0179284 A1 | 6/2015 | Alrod et al. | |
| 2015/0378815 A1 | 12/2015 | Goda et al. | |

FOREIGN PATENT DOCUMENTS

| | | |
|---|---|---|
| KR | 2015-0024140 A | 3/2015 |
| WO | WO-2013/134370 A1 | 9/2013 |
| WO | WO-2014/099065 A1 | 6/2014 |

OTHER PUBLICATIONS

Kim, et al., "Evaluation of Garbage Collection Techniques on Flash Translation Layer," Nov. 2006, retrieved from <http://calab.kaist.ac.kr/~maeng/pubs/ci2006.pdf>.

Wang, et al., "LDPC Decoding with Limited-Precision Soft Information in Flash Memories," Sep. 2012, retrieved from <http://arxiv.org.pdf/1210.0149,pdf>.

Office Action dated Aug. 11, 2016, which issued in Great Britain Application No. GB 1604222.8.

Japanese Office Action from Japanese Application No. 2016-054914, dated Feb. 7, 2017.

Korean Notice of Allowance from Korean Patent Application No. 10-2016-0032905, dated Nov. 13, 2017, 3 pages.

* cited by examiner

FIG. 4

READ LEVEL GROUPING ALGORITHMS FOR INCREASED FLASH PERFORMANCE

BACKGROUND

The present disclosure relates to the retrieval of information from flash memory devices, such as solid-state drives (SSDs). Lower priced Solid State Drives (SSD) are typically manufactured using multi-level cell (MLC) flash memory for increased data capacity, but MLC memory devices are sometimes less reliable than single-level cell (SLC) flash memory. Consumer SSD manufacturers have mitigated such problems by employing certain wear-leveling algorithms. Even with the increased data capacity of MLC flash memory, using MLC flash memory in enterprise applications becomes more expensive due to increased (wear causing) stresses required to read, program and erase the flash memory, causing a gradual degradation in endurance.

SUMMARY

The subject technology relates to a computer-implemented method of reading a plurality of flash memory cells in a storage device. According to various aspects, the method may include, dividing a plurality of flash memory wordlines of a flash storage device into a plurality of wordline groups based on read error counts associated with the wordlines and a plurality of read level offsets, associating each wordline group being associated with one of a plurality of normalized read level offsets, each read level offset being normalized for a best possible error rate resulting from using the offset with a read level to read the wordlines of the associated wordline group determined while dividing the plurality of flash memory wordlines, and storing associations between the plurality of normalized read level offsets and the plurality of wordline groups for use in connection with the read levels in to reading the flash memory cells during operation of the storage device wordlines of the respective wordline groups.

In various aspects, a method may comprise dividing a plurality of flash memory wordlines into a plurality of wordline group offset pairs, each pair comprising an offset voltage for a group of consecutive wordlines in a flash memory block, and storing the plurality of wordline group offset pairs for use in connection with a read level in reading the memory cells during operation of the storage device.

In various aspects, a data storage system comprises a plurality of flash memory devices, each flash memory device comprising a plurality of flash memory blocks, and a controller coupled to the plurality of flash memory devices. The controller may be configured to store a plurality of wordline group offset pairs for use in connection with a read level voltage in reading flash memory cells during a read operation, the wordline group offset pairs being formed from a division of a plurality of flash memory wordlines, wherein each pair comprises an offset voltage for a group of consecutive wordlines in a flash memory block.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

BRIEF DESCRIPTION OF THE DRAWINGS

FIG. 4 depicts an example table of error counts for an example range of read level offset values for multiple wordlines.

DETAILED DESCRIPTION

Figure 1:
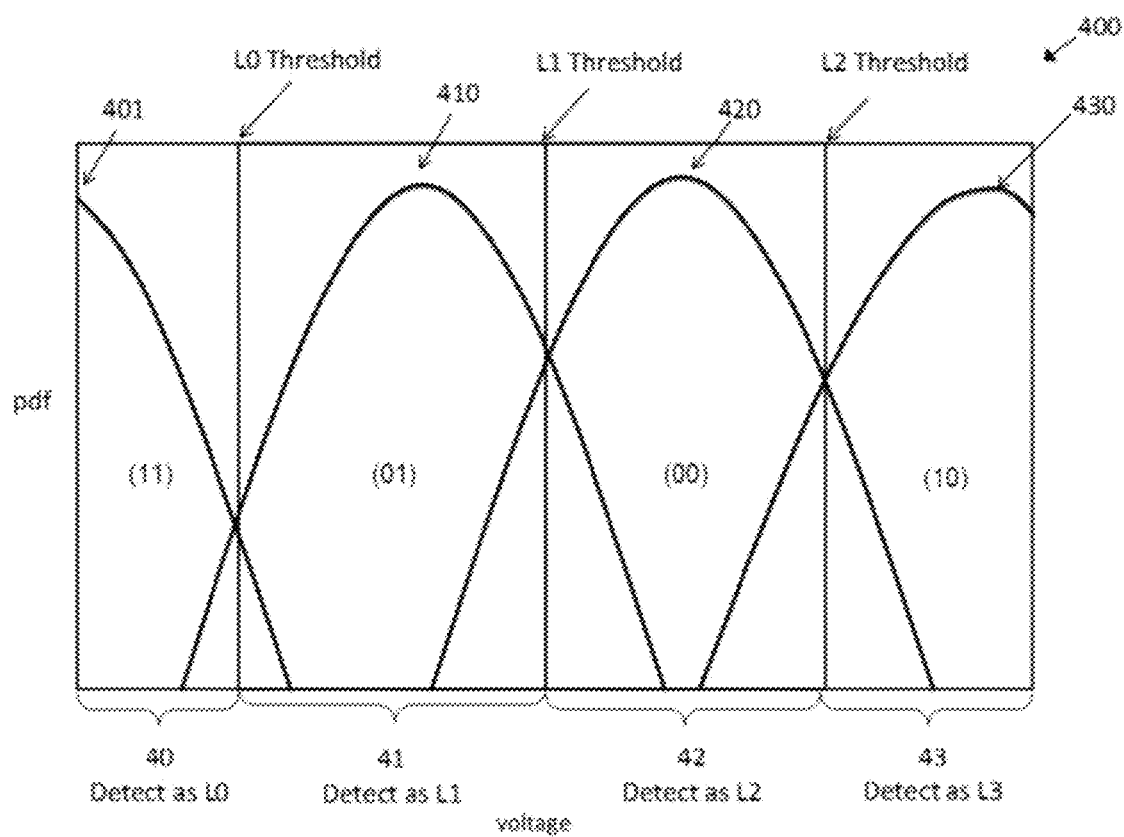
FIG. 1 is an example graph diagram of four possible cell threshold voltage ($V_T$) distributions and complimentary read levels for a group of memory cells in a multi-level cell (MLC) flash memory.

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent that the present disclosure may be practiced without these specific details. In some instances, structures and components are shown in block diagram form in order to avoid obscuring the concepts of the present disclosure. Like components are labeled with identical element numbers for ease of understanding.

In a flash memory device, for example, with NAND architecture, memory cells are grouped in strings, with each string consisting of a set of transistors connected in series between a drain-select transistor (connected to a respective bit line of a memory block) and a source-select transistor (connected to a reference voltage distribution line). Each memory cell includes a floating-gate MOS transistor. When programming a memory cell, electrons are injected into the floating gate, for example, by means of Fowler-Nordheim (F-N) Tunneling and/or hot-electron injection. The non-volatility of the memory cell is due to the electrons maintained within the floating gate. Bits are stored by trapping charge on the floating gate (an electrically isolated conductor) which stores a logic value defined by its threshold voltage (voltage required to conduct the cell) which is commensurate with the electric charge stored. When a memory cell is erased, the electrons in the cell's floating gate are pulled off by quantum tunneling (a tunnel current) from the floating gate to, for example, the source and/or substrate.

As a flash memory is cycled (that is, programmed and erased repeatedly), its physical qualities change. For example, the repeated placement and removal of electrons on the floating gate during programming and erase operations, respectively, causes some excess electrons to be trapped in the floating gate. Also, when one or multiple memory cells are programmed, adjacent cells may experience an unexpected and undesired charge injection to their floating gates, thus leading to corruption of data stored therein. For instance, electrons may leak into neighboring cells after prolonged stress due to the voltages at the gates of neighboring cells. The threshold voltages of these memory cells may eventually take values that are different (higher or lower) than expected values, causing errors when the data is read. Generally, the damage done becomes a function of the field strength (e.g., voltage) and duration; that is, programming the flash memory to high threshold voltage conditions increases the rate of damage arising from both program and erase processes because it requires longer duration and/or higher applied fields.

In various implementations, memory cells are arranged on a wafer in an array of columns (bitlines) and rows (wordlines). The address of a memory cell represents the intersection of a bitline and wordline corresponding to (e.g., indexing) the memory cell. Flash memory may further be composed of blocks, with each block divided into pages. In some implementations of MLC memory, every row of flash memory cells is composed of 2 pages: a least significant bit (LSB) page and a most significant bit (MSB) page. If a block has 128 pages then it may have 64 rows of cells, with each row having two pages. Each row of flash memory cells may behave differently in their ability to accurately store data, because when cells are physically together in a die they are subject to variations in voltages and resistances, and other characteristics that may have resulted from the manufacturing process.

In NAND architecture, it has been found that the problem of degradation is especially problematic because each transistor in the string of the cells being read (e.g., at a bitline) receives an elevated voltage stress, even though less than all of the cells of that string (e.g., at a location in the bitline corresponding to a designated wordline) may be read at any one time. Due to degradation, when programmed, the cells of some rows (wordlines) are further from their expected values (e.g., an expected voltage measured at a corresponding bitline) than others. It has been observed that these variations can be associated with individual wordlines. Accordingly, the subject technology characterizes these variations as a measurable value, and provides a mechanism to compensate for the variations at runtime. For example, if cell voltages in a wordline are found to shift (e.g., as a result of a characterization process) then a bias (e.g., an offset voltage) may be introduced during the program or subsequent read operation to correct the programmed voltage or read value. In this manner, the non-linearity of actual programming values between cells in different wordlines may be reduced, thereby reducing errors when reading the cells.

The same bias, however, may not be suitable for correcting read-related errors uniformly throughout a particular block or die. Additionally, storing bias values for each wordline or block can quickly consume memory useful for storage and may be become unmanageable and/or impede performance by requiring numerous lookups to apply the correct bias with every read operation. Accordingly, the subject technology provides a mechanism for determining and associating bias values with groups of wordlines, with the bias values optimized for the lowest possible read error rate for reading the wordlines within a group. The subject technology further provides a mechanism for optimizing the bias values over the lifetime of the memory cells. In this manner, the bias values may be efficiently stored and recalled, and corrected as needed, thereby improving the reliability and endurance of the overall flash memory cell architecture, making the flash memory suitable for enterprise applications.

FIG. 1 is an example graph diagram of four possible cell threshold voltage ($V_T$) distributions (401, 410, 420, and 430) and read levels (L0, L1 and L2 thresholds) for a group of memory cells in a multi-level cell (MLC) flash memory, according to aspects of the subject technology. MLC NAND flash memory provides for more than one bit per cell by choosing between multiple levels of electrical charge (read level) to apply to the floating gates of its cells to achieve multiple states of conductivity, each occurring at a different voltage threshold $V_T$. As depicted in FIG. 1, a MLC NAND cell is capable of storing one of four states (levels of charge) per cell, yielding two logical bits of information per cell: the Most Significant Bit (MSB) and Least Significant Bit (LSB). These two bits may make up corresponding MSB and LSB pages of a memory block.

FIG. 1 depicts probability density distribution curves 400 for a group of memory cells (e.g., in a block) programmed to data levels L0, L1, L2, and L3. The distributions 401, 410, 420, and 430 correspond to the probability density distribution curves for L0, L1, L2, and L3 data levels, respectively. Each data level is separated by a respective threshold voltage level. In the depicted example, the threshold voltage levels are identified as L0 threshold, L1 threshold, and L2 threshold. The threshold voltage levels are used by a threshold detector (e.g., within the flash memory) as "read levels" to determine, for example, if a read signal should be read as being in distribution 401, 410, 420, or 430. The four cell distributions 401, 410, 420, and 430 of FIG. 1 may be obtained from lab data.

To ensure that all cells in a distribution will conduct, a read level voltage greater than the highest cell voltage in the distribution is applied. In various examples described herein, a first read level RL1 corresponds to the L0 threshold voltage, a second read level RL2 corresponds to the L1 threshold voltage, and a third read level RL3 corresponds to the L2 threshold voltage. In this regard, RL1 voltage will cause cells in the L0 distribution to conduct, RL2 voltage will cause cells in the L1 and L0 distributions to conduct, RL3 voltage will cause cells in the L2, L1, and L0 distributions to conduct, and so on. Where, as depicted by FIG. 1, only four states are available, RL3 voltage will not cause any cells in L3 distribution to conduct. Generally, for N distributions there will be N−1 read levels. In the depicted example, there are four distributions (states) and three read levels. However, it is understood that there may be eight, sixteen, or more distributions without departing from the scope of the subject technology.

Figure 2A:
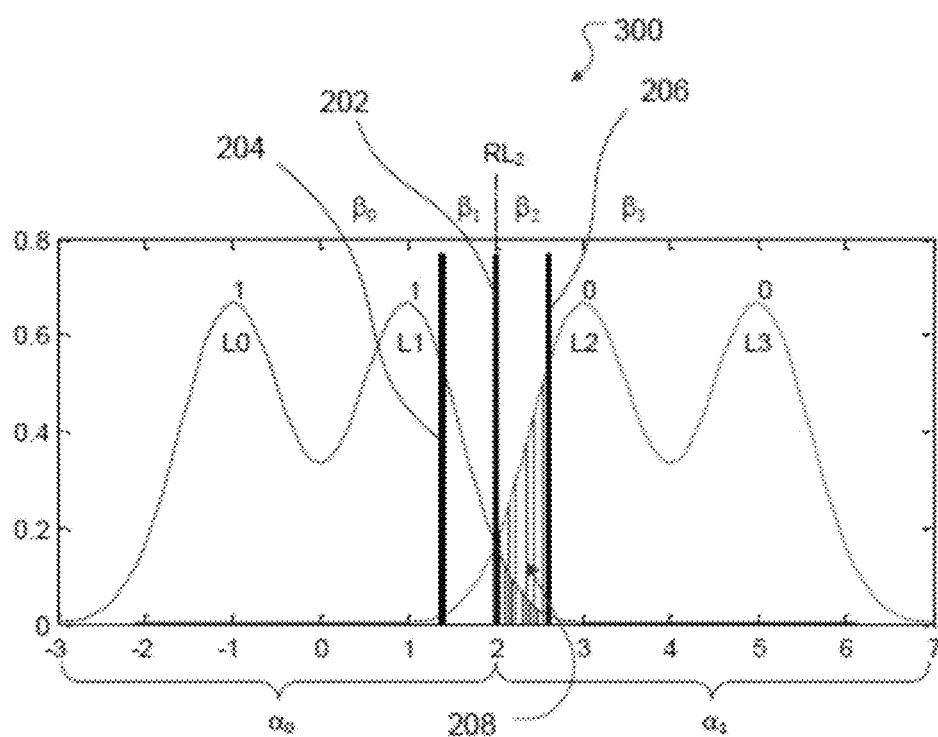
FIG. 2A depicts an example probability distribution for a least significant bit (LSB) page using multiple read levels.

FIG. 2A depicts an example probability distribution for a LSB page using multiple read levels, according to aspects of the subject technology. In the depicted example, a first read level 202 ("RL2") is used in a first read of a LSB page to determine putative program levels for the memory cells of the LSB page. To determine a probability that the memory cells were actually programmed to the observed putative program levels, multiple "soft" reads below and/or above read level 202 may be initiated.

In the depicted example, the memory cells are read using a second read level 204 below the first read level 202 and a third read level 206 above the first read level 202. A first program region $\beta_1$ includes one or more cells having a programmed value between the first read level 202 and the second read level 204, and a second program region 132 comprises one or more cells having a programmed value between the first read level 202 and the third read level 206. The various regions between read levels may be referred to herein as "bins." In various aspects, a probability value may be calculated for each bin based on how many of the memory cells are in the bin compared to one or more other bins. A probability may also be determined for a bin based on the size of an area 208 (shown as a hatch pattern) under the distribution curve for the bin. Based on the probability, the reliability value is then generated and assigned to each memory cell in the bin. As will be described further, reliability values may include log-likelihood ratios.

Figure 2B:
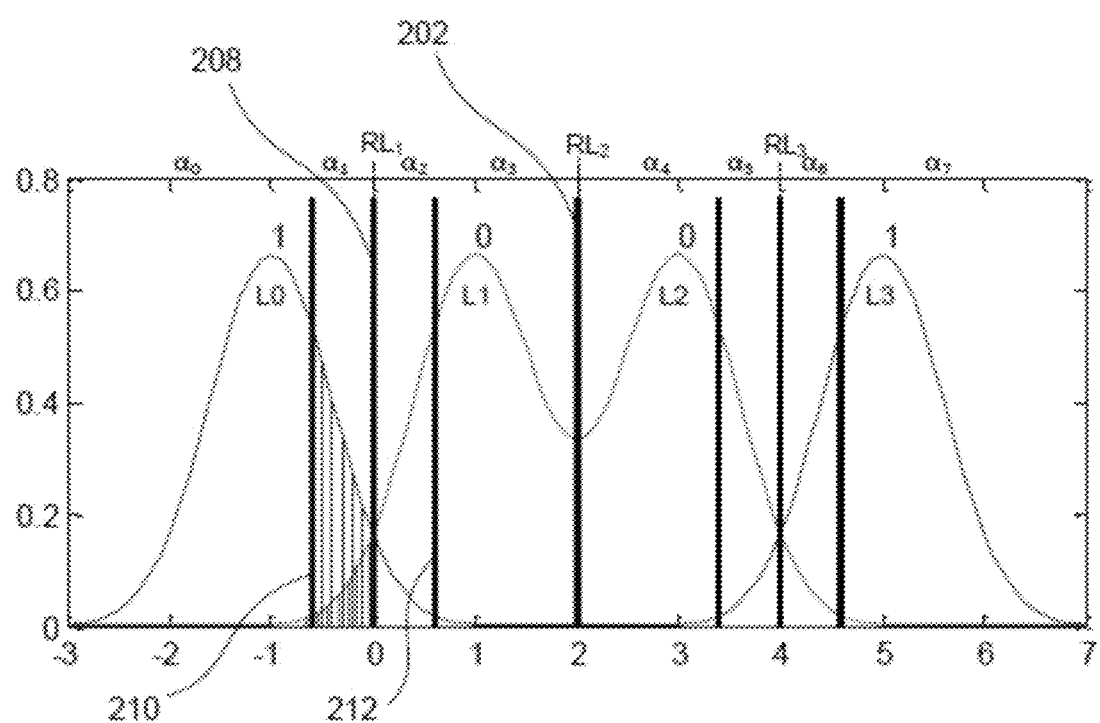
FIG. 2B depicts an example probability distribution for a most significant bit (MSB) page of MLC flash memory using multiple read levels.

FIG. 2B depicts an example probability distribution for a MSB page of MLC flash memory using multiple read levels. According to aspects of the subject technology, an initial read level 202 may be applied to one or more memory cells to obtain a LSB value for each memory cell. In the depicted example, read level 202 is chosen as the crossover location between the distributions of coded bit 1 and coded bit 0 (as shown in FIG. 2A) to minimize an expected bit error rate (BER). Read levels chosen to minimize BER are called optimal read levels.

Based on the LSB value, a read level 208 may be determined for reading a putative program level for the MSB. Once read level 208 is determined and the putative program level read using read level 208, multiple subsequent soft reads (e.g., 210 and 212) around read level 208 may be initiated to determine a probability that the MSB was actually programmed to the observed putative program level. Accordingly, the programmed value of each cell may be associated with a program region (bin) $\alpha_0, \alpha_1, \alpha_2, \alpha_3, \alpha_4, \alpha_5, \alpha_6,$ and $\alpha_7$ corresponding to the level at which the cell was found to conduct or not conduct when the LSB and MSB reads, and associated soft reads, are applied.

Figure 3:
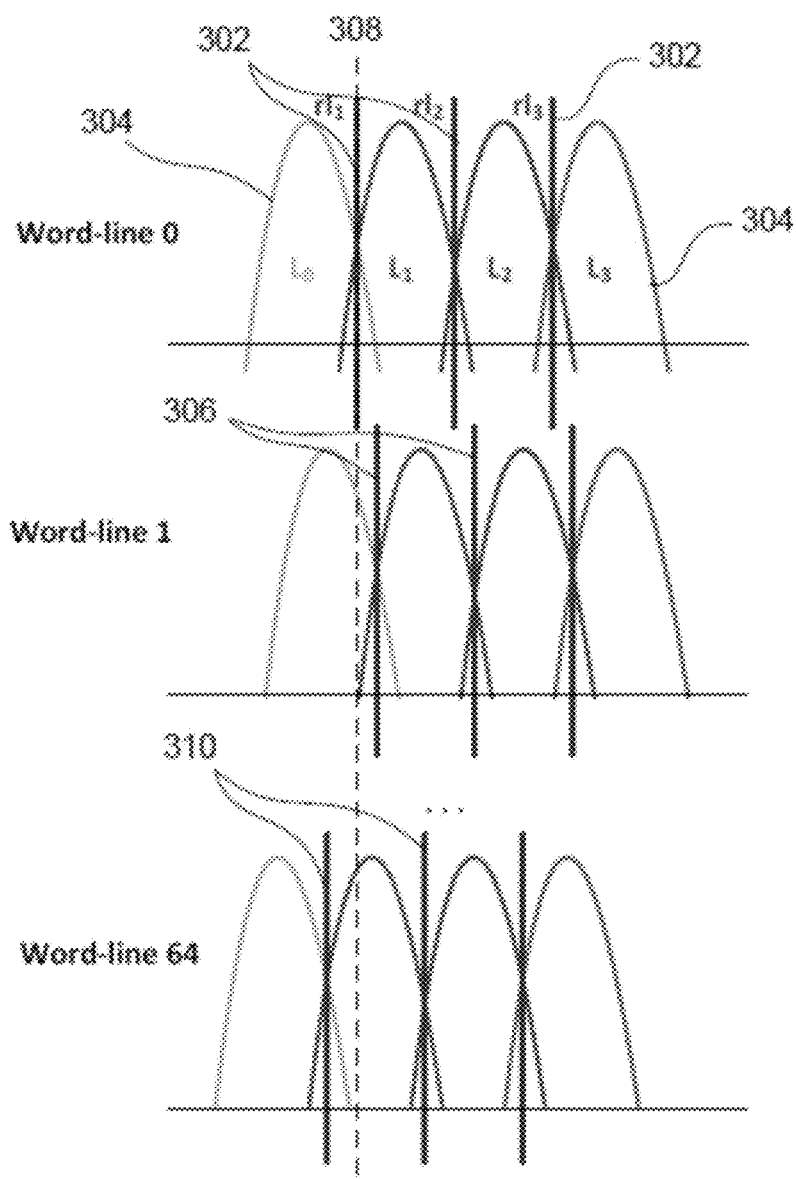
FIG. 3 depicts example optimal read level voltage variations for multiple wordlines of a memory block.

FIG. 3 depicts example optimal read level voltage variations for multiple wordlines of a memory block, according to aspects of the subject technology. A memory block may have up to (or more than) 64 wordlines. Lab results have indicated that optimal read levels 302 (e.g., RL1, RL2, or RL3) may vary from wordline to wordline. In the depicted example, three read levels RL1, RL2, and RL3 are optimally set at their respective reference values to read memory cells in probability density distribution curves 304 corresponding to data levels L0, L1, L2, and L3. However, the values or voltages of these read levels 302 are shown to change with respect to each wordline. For example, read levels 306 for wordline 1 are shifted to the right with respect to a reference point 308, thereby exhibiting a slightly increase value, while read levels 310 for wordline 64 is shifted left of reference point 308 having a slightly decreased value. As will be described further, each of these shifts in voltages for each read level may be represented as bias values, or read level offsets, from a respective primary read level voltage.

Figure 4:
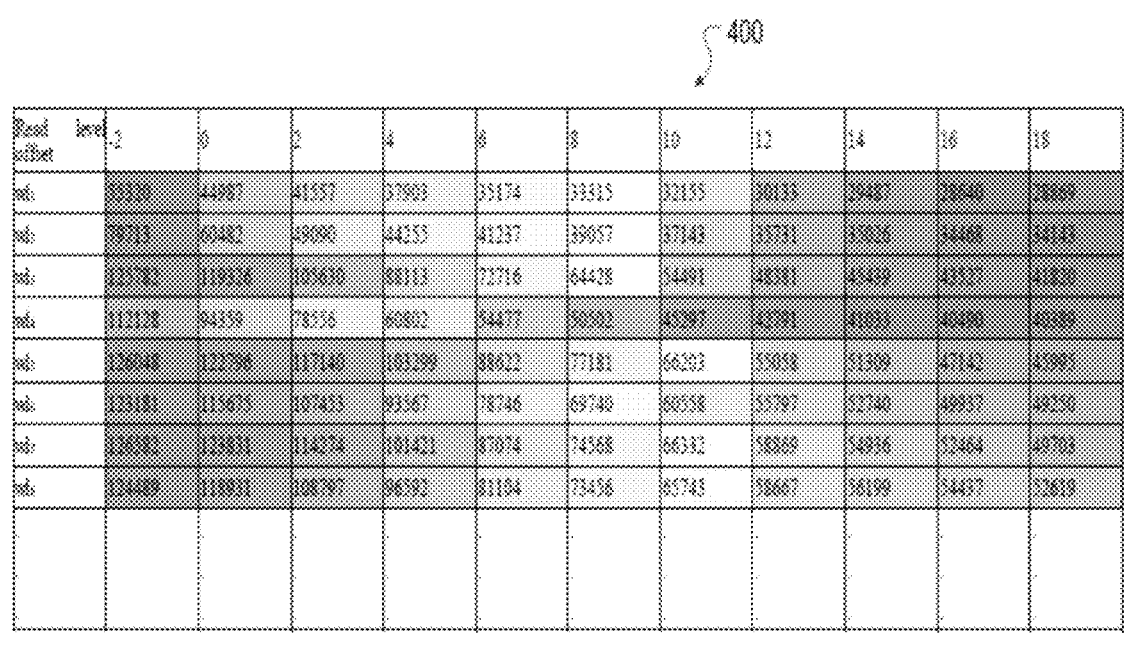

FIG. 4 depicts an example table of error counts 400 for an example range of read level offset values for multiple wordlines, according to various aspects of the subject technology. As explained above, the optimal read level used to read a particular state of memory cell may vary from wordline to wordline, illustrating that each wordline may have a unique set of characteristics with respect to each other. The variations in optimal read levels between wordlines may be shown by modifying a primary read level by a particular bias, also referred to herein as "read level offset." The read level offset may be different for each wordline and/or each block and/or each memory die. In this regard, multiple offsets may be applied: one for each wordline, one for each block, and/or one for each memory die.

Each row of the table 400 is representative of a different wordline, while each column representative of a different read level offset value. Each wordline of a block may be represented in the table. The error counts listed in the example table are the number of errors produced when reading the corresponding wordline at the corresponding offset value. The error counts may be indexed by wordline and read level offset value. The read level offset values are represented in "ticks" from a primary read level voltage. In some implementations every two ticks may be the equivalent of 25 mV. Additionally, there may be a different table for each read level voltage. For example, the depicted table may be for RL1, while a different table provides error counts for reading the same wordlines with RL2, and a different table provides error counts for reading the same wordlines with RL3.

The table may be initially generated based on lab data. In at least one example, the table of error counts may be generated based on reading the wordlines of a memory block, with each wordline being read multiple times using a selected read level voltage modified for each read by a different offset voltage. Accordingly, an error count is produced for each offset voltage, and the table is generated for indexing the error counts by a wordline number and respective offset voltages.

Figure 5A:
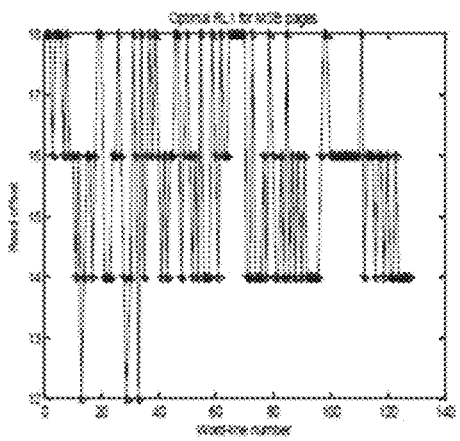
FIGS. 5A to 5C depict charts of example optimal read level offsets for cycled memory blocks.
Figure 5B:
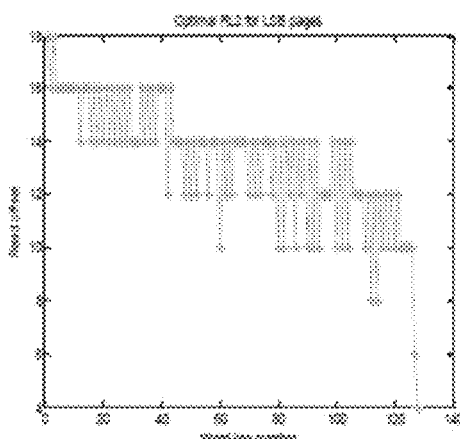
Figure 5C:
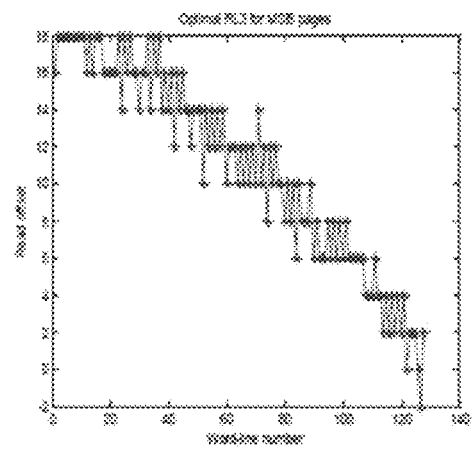

FIGS. 5A to 5C depict charts of example optimal read level offsets for cycled memory blocks, according to various aspects of the subject technology. As explained above, as memory cells are cycled they may experience some degradation. Accordingly, distributions L0, L1, L2, and/or L3 may drift or move from the expected values, and new optimal read levels are required to read the cells at their new values with minimal errors. In the depicted examples, optimal read level offset values are charted for 128 wordlines (0-127) of a memory block for primary read levels RL1, RL2, and RL3. FIG. 5A is representative of example reads of MSB pages using RL1, and depicts how read level offset values may vary between 18 and 12 ticks before settling at 14 ticks for the higher wordline numbers. FIG. 5B is representative of example reads of LSB pages using RL2. FIG. 5B depicts how a greater offset (i.e., 18 ticks) is required at lower wordline numbers (e.g., at the beginning of a block) than at higher wordline numbers (e.g., at the end of a block). The read level offset to apply to RL2 is seen to generally decline in value, from 18 ticks for wordline 0, to 10 ticks for wordline 120, and then finally to 4 ticks at wordline 127. FIG. 5C depicts a read level offset applied to RL3 declining linearly from 18 ticks for wordline 0 to −2 ticks at wordline 126, and then +2 ticks at wordline 127.

Determining Read Level Offset Groups for Use During Read Operations

Figure 6:
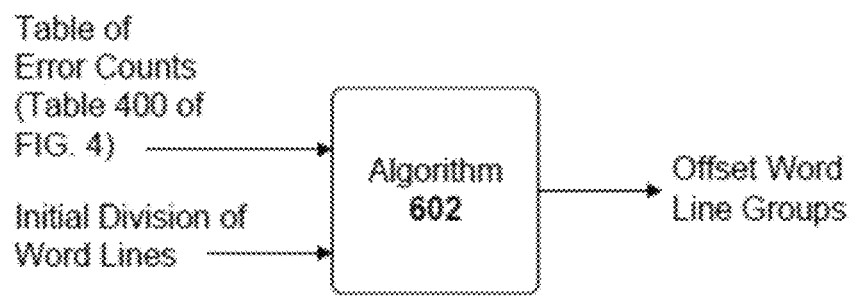
FIG. 6 depicts a block diagram of an example algorithm for generating offset wordline groups.

FIG. 6 depicts a block diagram of an example algorithm for generating offset wordline groups, according to various aspects of the subject technology. Algorithm 602 may be implemented as computer software (e.g., instructions executing on a computing device), electronic hardware, or combinations of both. Storing the offset values required to provide optimal read levels for reading memory cells in, e.g., each of the 128 wordlines using three (or more) different read levels would consume a large amount of memory space. Accordingly, the subject technology implements a read level profiling algorithm 602 that reduces the amount of offset values (or read levels) required to be stored while providing a close to optimum bit error rate reduction in memory read operations. Read level profiling algorithm 602 reduces the number of stored read level offsets while not degrading the bit error rates produced by corresponding read operations that could increase hard or soft decoding failures.

The example read level grouping algorithm 602 takes as inputs initial boundary conditions, e.g., in the form of an initial division of wordlines for a block, a desired number of wordline groups, and the previously described table of error counts 400. Each division of wordlines defined by the boundary conditions forms a set of candidate (input) wordline groups, each made up of consecutive wordline addresses. For example, the initial boundary conditions may designate four candidate groups, with group 1 as wordlines 0-31, group 2 as wordlines 32-63, group 3, as wordlines 64-95, and group 4 as wordlines 96-127. These candidate groups set up initial boundary conditions that algorithm 602 will use to analyze error rates and to ultimately generate optimal boundary conditions for forming optimal (output) offset wordline groups for use in read operations during operation of a storage device.

Example algorithm 602 takes table 400 of FIG. 4 and the initial boundary conditions and outputs optimal offset wordline groups. Each optimal offset wordline group output by algorithm 602 includes a consecutive portion of the total wordlines input as part of the initial conditions (e.g., 128 wordlines). The boundaries of the optimal offset wordline groups output by algorithm 602 may or may not be the same as the initial boundary conditions, and in many cases will be different. Each optimal offset wordline group includes consecutively grouped wordlines paired with a corresponding optimal offset voltage for the group. The groups may be consecutively ordered with respect to their wordlines.

In various implementations, each pairing of each optimal offset wordline group to each respective optimal offset voltage is automatically selected by the algorithm for an overall lowest possible error count for reading wordlines in each of the offset wordline groups, and the groups as a whole. Generally, the set of optimal offset wordline groups generated by algorithm 602 are generated, at least in part, based on iteratively indexing table 400 based on wordline location and offset values for each initial set of wordline groups to determine a best fit, or normalized, error count for each output group. Accordingly, read level grouping algorithm 602 outputs optimal offset wordline groups (e.g., as boundaries for each group) and the optimal read level offsets (or read levels) for each group offering the least bit error rate degradation, e.g., based on the input table 400.

Figure 7:
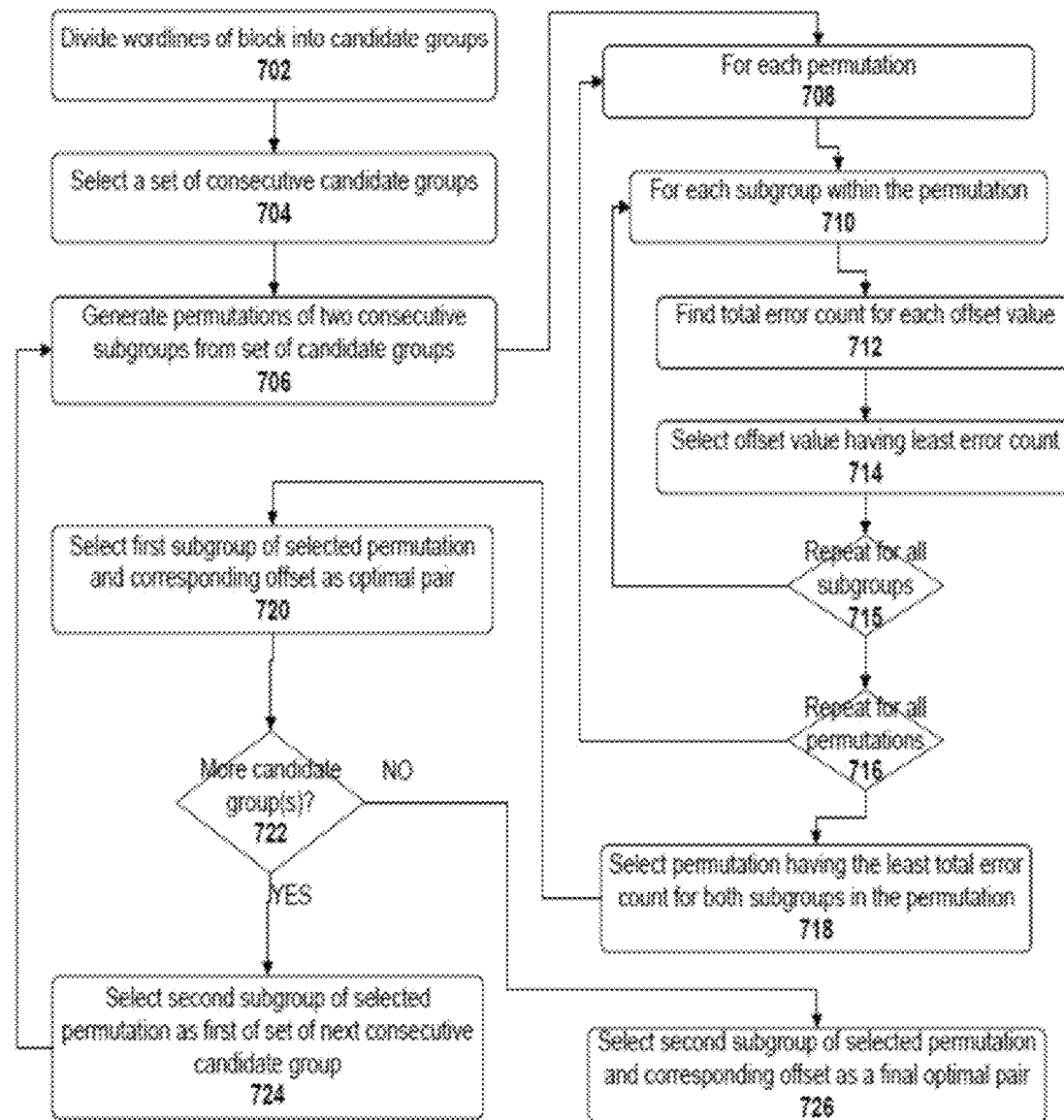
FIG. 7 depicts a flow diagram of a first example process for generating offset wordline groups.

FIG. 7 depicts a flow diagram of a first example process 700 for generating offset wordline groups, according to various aspects of the subject technology. For explanatory purposes, the various blocks of example process 700 are described herein with reference to the components and/or processes described herein. One or more of the blocks of process 700 may be implemented, for example, by one or more processors, including, for example, controller 1501 of FIG. 15 or one or more components or processors of controller 1501. In some implementations, one or more of the blocks may be implemented apart from other blocks, and by one or more different processors or controllers. Further for explanatory purposes, the blocks of example process 700 are described as occurring in serial, or linearly. However, multiple blocks of example process 700 may occur in parallel. In addition, the blocks of example process 700 need not be performed in the order shown and/or one or more of the blocks of example process 700 need not be performed.

According to various implementations, one or more blocks of process 700 are implemented by read level grouping algorithm 602. In this regard, the blocks of process 700, or subset thereof, may be executed for each possible read level used in a flash memory device. For example, the blocks of process 700 may be executed to generate optimal offset wordline groups for RL1, RL2, and RL3 based on table 400 and input boundary conditions. In various aspects, offset wordline groups of different sizes and/or having different offset value pairings may be generated for each different read level. Additionally, the blocks of process 700 may be executed to generate different groups for different blocks, and or die. Process 700 may be implemented during configuration of a storage device, prior to or during operation.

Generally, for each initial boundary condition, process 700 executes a number of iterative steps to automatically select optimal group boundaries and corresponding optimal read level offsets for each group that offer the least increase in overall bit error rate compared to optimal bit error rate, as determined by a corresponding input table 400. For a number of candidate groups defined by the boundary conditions, algorithm 602 may select two consecutive groups k and k+1, and beginning from the first element of the first group until the last element of the second group, consider all possible two consecutive divisions.

In the depicted example, wordlines of a block are divided into candidate groups (702). In an example in which 128 wordlines are used, the block may be divided into four candidate groups, with group 1 as wordlines 0-15, group 2 as wordlines 16-31, group 3, as wordlines 32-79, group 4 as wordlines 80-127. The division of the block and resulting number of candidate groups may be selected based on lab data, or selected based on dividing the total number of wordlines of the block equally. As described previously, the division of groups may be represented as boundaries of the groups. Process 700 then selects a set of consecutive candidate groups (704). For example, groups 1 and 2 may be selected, thereby forming a set of wordlines between 0 and 31. Permutations of multiple consecutive subgroups from the set are considered (706). In various examples herein, permutations of two subgroups are considered, however more subgroups may be considered. Since, in the given example, the subgroups are consecutive, and the wordlines within the group consecutive, the maximum number of permutation for n wordlines will be n−1 permutations. Permutations of an example set of wordlines spanning 0-31 may include {[0, 1-31], [0-1, 2-31], [0-3, 4-31] . . . [0-30, 31]}.

Example process 700 is depicted as a min-average algorithm. That is, for each possible permutation, the average error count is computed based on a corresponding error table, and then the subgroups within the permutations are compared to select those with the fewest error counts. In this regard, error counts for each subgroup are computed using all available read level offsets based on the error count table 400, and the read level offsets that offer the least error counts for each permutation are determined. In the depicted example, process 700 begins at (or selects) a first permutation (708) and then, for each subgroup within the permutation (710), finds the total error count corresponding to the subgroup for each offset value represented in the input table 400 (712). The total error count may be found, e.g., by indexing table 400 by a first offset value represented in table 400 and each wordline within a first (i=1) subgroup to determine error counts for each wordline within the subgroup, and then summing the determined error counts. Total error counts for the other offset values represented by table 400 are determined in the same way, and the resulting sums of error counts are compared to identify the offset value having the least error count for the subgroup. The identified offset value is then selected and associated with the subgroup (714). The same process is applied to the next subgroup of the permutation (715).

The foregoing process is repeated (716), restarting at block 708, until an offset value is associated with each subgroup of each permutation, each subgroup also being associated with a total error count corresponding to the associated offset value. Table 1, below, provides example offset associations for three permutations of two subgroups.

TABLE 1

| Permutation | First Subgroup Offset | Second Subgroup Offset | First Subgroup TEC | Second Subgroup TEC |
|---|---|---|---|---|
| 0, 1-31 | 16 | 14 | 28640 | 16254321 |
| 0-1, 2-31 | 18 | 16 | 63012 | 16222110 |
| 0-2, 3-31 | 18 | 18 | 104832 | . . . |
| 0-3, 4-31 | 18 | 18 | . . . | . . . |

Once offset values are associated with each subgroup of each permutation, process 700 selects a permutation having the least total error count (718). The least total error count may be the total error count of both subgroups within the permutation, or the first or second subgroup, depending on the implementation of the algorithm used. In various examples, the total error count summed across all the wordlines (both subgroups) is used to compare permutations. Process 700 continues by selecting the first subgroup and its corresponding offset of the selected permutation as an optimal pair (720).

In the depicted example, process 700 determines whether there are more candidate input groups (722). If a next (e.g., third) candidate group exists (e.g., wordlines 32-47 in the above example), the second (previously unselected) subgroup of the permutation identified at block 718 is then selected and refactored into the algorithm with the next candidate group (724). In the above example, if the first subgroup includes wordline boundaries of 0-22 generated based on a first and second candidate groups (having wordline boundaries of 0-31) then the second subgroup having wordlines 23-31 will be used in the next set of candidate groups together with the next subsequent candidate group input into the algorithm. Therefore, in the above example, the next set of candidate groups would include a candidate group having wordlines 23-31 and a candidate group having wordlines 32-47. If a next candidate group does not exist then the algorithm may select the second subgroup and its corresponding offset of the permutation identified in block 718 as a final optimal pair (726).

In some implementations, blocks 702 through 726 may be repeated until the output group boundaries do not change from one iteration to the next iteration, or until an overall bit error rate measured for the consecutive wordline subgroups does not change from one iteration to a next iteration, or a certain number of iterations is reached. Each iteration may be run using the output boundary conditions produced at the end of block 726. Randomization may also be introduced within process 700. For example, permutations may be generated that include subgroups that are not in any particular order. A first subgroup may include wordlines 13-31 and a second subgroup may include wordlines 0-12. As the optimal pairs are identified (or after the iterative process has been completed), the optimal pairs are stored for use in reading the memory cells during operation of the storage device. The storage device may then, during a read operation, match the wordline that is the subject of the read operation to a group of an optimal pair, and use the offset of the optimal pair in reading the memory cells of the wordline.

While example process 700 is depicted as a min-average algorithm, other types of algorithms may be implemented. For example, a min-max algorithm may be implemented. In this manner, block 712 may be modified to, for each subgroup within the permutation (710), find the maximum error count of all wordlines in the subgroup for each offset value (712). The error counts may be found, e.g., by indexing table 400 by a first offset value and comparing the error count indexed by the first offset value and each wordline in the subgroup (e.g., wordlines 0, 1, 2, and 3 in the first subgroup of permutation {[0-3], [4-31]}). The maximum error counts found for each offset value are then compared, and the offset value corresponding to the minimum of all maximum error counts is then selected and associated with the subgroup (714). The same process may be applied to the next subgroup of the permutation. Before moving to the next permutation, in block 715, the maximum of the minimum error counts selected for the subgroups (of the current permutation) are noted. Once a maximum has been noted for each permutation, in block 718, the permutation associated with the minimum of these values is then selected. One benefit of process 700 implementing a min-max algorithm includes keeping errors below a maximum capacity of the error correction coding used by the storage device to correct errors.

In certain aspects, the subject technology may include the implementation of different blocks or steps than those discussed above with respect to example process 700. By utilizing previously selected initial boundary conditions and table 400, process 700 outputs boundaries for optimal offset wordline groups, including the optimal read levels for each group offering, e.g., the least bit error rate degradation for each wordline in each group from optimal values in table 400.

Figure 8:
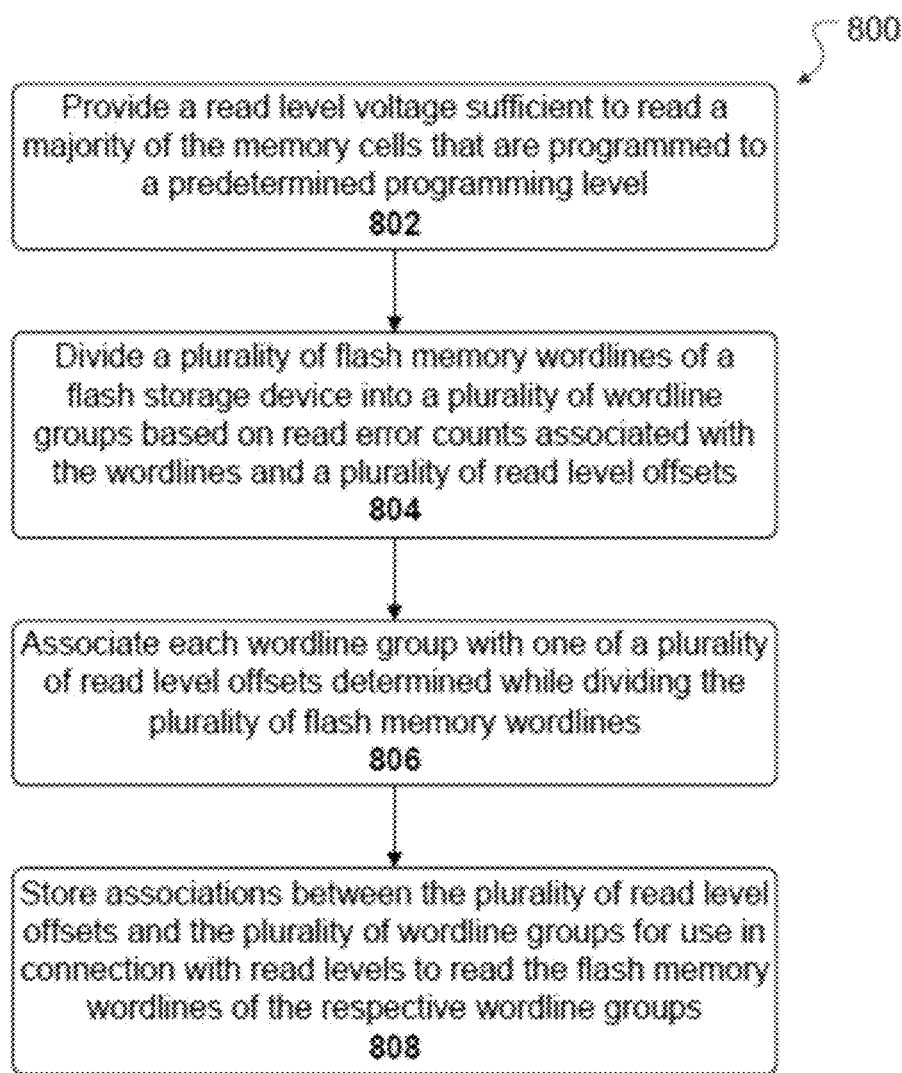
FIG. 8 depicts a flow diagram of a second example process for generating offset wordline groups.

FIG. 8 depicts a flow diagram of a second example process 800 for generating offset wordline groups, according to various aspects of the subject technology. For explanatory purposes, the various blocks of example process 800 are described herein with reference to the components and/or processes described herein. The one or more of the blocks of process 800 may be implemented, for example, by one or more processors, including, for example, flash memory controller 1501 of FIG. 15 or one or more components or processors of controller 1501. In some implementations, one or more of the blocks may be implemented apart from other blocks, and by one or more different processors or controllers. Further for explanatory purposes, the blocks of example process 800 are described as occurring in serial, or linearly. However, multiple blocks of example process 800 may occur in parallel. In addition, the blocks of example process 800 need not be performed in the order shown and/or one or more of the blocks of example process 800 need not be performed.

According to various implementations, a portion of the blocks of process 800 may be executed by algorithm 602. The blocks of process 800, or subset thereof, may be executed for each possible read level used in a flash memory device. For example, the blocks of process 800 may be executed to generate optimal offset wordline groups for RL1, RL2, and RL3 based on table 400 and input boundary conditions. In various aspects, offset wordline groups of different sizes and/or having different offset value pairings may be generated for each different read level. Additionally, the blocks of process 800 may be executed to generate different groups for different blocks, and/or die. Process 800 may be implemented during configuration of a storage device, prior to or during operation.

In the depicted example, a flash memory device provides a read level voltage sufficient to read memory cells that are programmed to a programming level (802). For example, the read level voltage may be pre-programmed into a state machine of flash memory device by the manufacturer or the storage device controller. In some implementations, each memory cell is a multi-level flash memory cell configured to be programmed to one of four programming levels. For example, with reference to FIG. 2B, L0 and L3 programming levels may be associated with first bit values (e.g., representative of a binary value of a most significant bit) and L1 and L2 programming levels may be associated with the second bit values (e.g., representative of a binary value of a least significant bit). As described previously, when voltage is applied to a memory cell at a particular read level (e.g., RL1, RL2, RL3) corresponding to the program level of the cell the cell will conduct indicating the program level.

The system divides a plurality of flash memory wordlines of a flash storage device into a plurality of wordline groups based on read error counts associated with the wordlines and a plurality of read level offsets (804). Each of the optimal wordline groups is made up of consecutively ordered wordlines of a memory block, with wordlines of a first one of the groups preceding wordlines of a second one of the groups. In this regard, each offset is chosen for a best error rate resulting from use of the offset with the read level voltage to read the wordlines of a corresponding wordline group. For example, respective permutations of consecutive wordline subgroups may be selected from within a predetermined set of wordline candidate groups based on a minimum of total error counts associated with the respective permutations (e.g., blocks 708-720 of FIG. 7), and each of the consecutive wordline subgroups may be associated with a read level offset corresponding to a minimum of error counts associated with a plurality of possible read level offsets.

With reference to FIG. 7, first and second consecutive wordline groups may be selected from the predetermined set of candidate wordline groups (704). As described previously, the candidate wordline groups may be based on initial boundary conditions. A plurality of subgroup permutations may then be provided for the selected first and second consecutive wordline groups (706), with each subgroup permutation comprising multiple consecutive wordline subgroups of wordlines spanning the first and second consecutive wordline groups. For each wordline subgroup of a respective subgroup permutation, a respective read level offset may be selected from the possible read level offsets such that, when used with the read level voltage to read the wordlines in the wordline subgroup, the respective read level offset generates the least number of errors for the wordline subgroup (714). The plurality of subgroup permutations having a lowest total error count for consecutive wordline subgroups in the subgroup permutation may then be selected (718). Accordingly, the plurality of wordline groups may be based at least in part on one or more read level offsets corresponding to the selected one of the plurality of subgroup permutations.

In some implementations, dividing the plurality of wordlines into the plurality of wordline groups includes selecting respective permutations of consecutive wordline subgroups from within a set of wordline candidate groups (e.g., predetermined by the input boundary conditions) based on a minimum of maximum error counts associated with the respective permutations, with the consecutive wordline subgroups each being associated with a read level offset corresponding to a minimum of error counts associated with a plurality of possible read level offsets. As an example, for each wordline subgroup of a permutation, the system may determine an error count associated with reading wordlines (e.g., a maximum error count or an error count corresponding to a wordline in the group having the largest error count) in the wordline subgroup for each possible read level offset (used with the read level voltage to read the wordlines of the wordline subgroup). The read level offset corresponding to the minimum of the determined error counts may then be selected from the plurality of possible read level offsets for the wordline subgroup (see, e.g., 712). In this example, if there are two wordline subgroups in the permutation then there may be two different (minimum) error counts that have been selected for the permutation (and two corresponding read level offsets).

For each subgroup permutation, the maximum error count of the error counts associated with the wordline subgroups of the subgroup permutation is noted. The subgroup permutation having the minimum of the determined maximum error counts is then selected (see, e.g., 718). In this manner, each wordline group is associated with one of a plurality of read level offsets determined while dividing the plurality of flash memory wordlines (806).

In one or more of the above implementations, each consecutive wordline subgroup of a respective permutation may be generated based on an interleaving of consecutive wordlines within the predetermined set of candidate wordline groups. Interleaving may be used to introduce randomization. For example, a first wordline subgroup in a subgroup permutation may include wordlines 14-31, followed by a second subgroup that includes wordlines 0-13. In a subgroup permutation that includes three subgroups (e.g., using three subgroups in block 706 of FIG. 7 instead of two subgroups), a first wordline subgroup of the permutation may include wordlines 4-6, a second wordline subgroup of the permutation may include wordlines 0-3, and a third wordline subgroup of the permutation may include wordlines 7-32.

Additionally, each respective read level offset may be generated (e.g., using any of the implementations above) based on indexing a table of error rates, with each error rate in the table being indexed based on a respective read level offset and a respective wordline. In this manner, the table may be indexed by a plurality of consecutive wordlines to identify corresponding read level offsets having a lowest error rate for each consecutive wordline, and determining a group of the consecutive wordlines that when associated with a single identified offset have a minimum possible error rate for the group of the consecutive wordlines. Accordingly, each wordline group is associated with one of a plurality of read level offsets determined while dividing the plurality of flash memory wordlines (806).

Once the wordline groups have been generated, the associations between the plurality of read level offsets and the plurality of wordline groups are stored for use in connection with read levels to read the flash memory wordlines of the respective wordline groups (808). In this regard, the foregoing process automatically selects optimal group boundaries and corresponding optimal read level offsets for each group that offer the least increase in overall bit error rate compared to optimal bit error rate.

Many of the above-described features of example processes 700 and 800 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

In low-density parity-check (LDPC) applications, a LLR may include the logarithm of a ratio between the probability of a read bit being "0" or "1". The LLR may span a predetermined range. For example, in some implementations, an LLR may span the range −255 to +255. A positive LLR may generally indicate that a signal read from the memory cell is likely to be a 0-bit, and a negative LLR may generally indicate that a signal read from the memory cell is likely to be a 1-bit. The LLR may be associated with the bit value read from the memory cell. A bit associated with an LLR equal to 5 may be more likely to be a binary zero than a bit having an assigned LLR equal to 1. A bit having an assigned LLR equal to 0 may be equally likely to be a binary one or zero.

If, at a certain read level, a 0-bit is read from a memory cell then a positive LLR may be assigned. If a 1-bit is read then a negative value may be assigned. In a multi-level memory cell having two bits, there are multiple potential cell distribution levels (for example, L0, L1, L2, and L3). Distinguishing between a binary one and a binary zero in a read of a MSB may require determinations across multiple read level boundaries. In the example of FIG. 1, distinguishing between a 0 and a 1 requires determining whether the cell conducts within the middle two distributions L1 and L2 (e.g., for a binary 0x), or in the end distributions L0 and L3 (e.g., for a binary 1x). Accordingly, multiple read levels may be involved (for example, RL0 and RL2) to make that determination.

Calibrating Read Levels and Read Level Offsets

Figure 9:
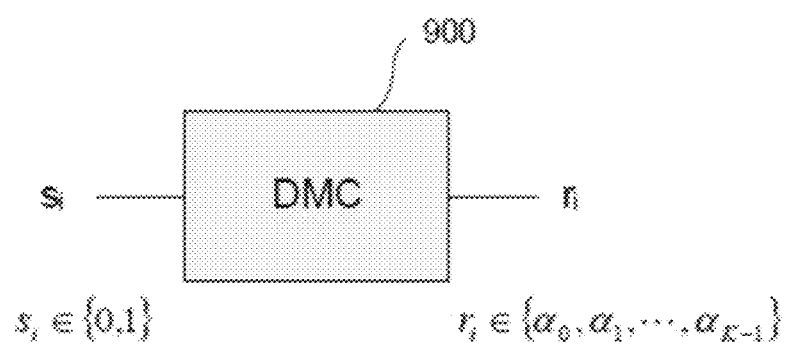
FIG. 9 depicts an example flash memory channel modeled as a discrete memory-less channel (DMC) with binary inputs and K-ary outputs.

FIG. 9 depicts an example flash memory channel 900 modeled as a discrete memory-less channel (DMC) with binary inputs and K-ary outputs, according to aspects of the subject technology. In this example, the K-ary outputs correspond to K cell program regions (bins) that may be identified with multiple reads. The model of channel 900 provides a definition for a log-likelihood ratio (LLR). Using this model, the LLR may be defined as:

$$LLR_i = \log\frac{p(s_i = 0 \mid r_i)}{p(s_i = 1 \mid r_i)} = \log\frac{p(r_i \mid s_i = 0)p(s_i = 0)/p(r_i)}{p(r_i \mid s_i = 1)p(s_i = 1)/p(r_i)} \quad (1)$$

where $s_i$ is the presumed (correct) input data bit that has been stored for a particular cell and/or page, and where $r_i$ is the soft value corresponding to a bin that is read from the flash memory, and where p represents the (conditional) probability of being in the region represented by $r_i$ given that the bit value was programmed to $s_i$.

In some implementations it may be assumed that all inputs are equally probable; as such the expression of Equation (1) becomes:

$$LLR_i = \log\frac{p(r_i \mid s_i = 0)}{p(r_i \mid s_i = 1)} \quad (2)$$

With reference to FIG. 2A, if K=2 for a LSB page read, the K regions are designated as $r_i \in \{\alpha_0, \alpha_1\}$ wherein the LLR for region $\alpha_1$ of FIG. 2A is given by:

$$LLR(\alpha_1) = \log\frac{p(r_i = \alpha_1 \mid s_i = 0)}{p(r_i = \alpha_1 \mid s_i = 1)} \quad (3)$$

With reference to FIG. 2B, in the case that K=8 for an MSB page read, the regions may be designated as:

$$r_i \in \{\alpha_0, \alpha_1, \alpha_2, \alpha_3, \alpha_4, \alpha_5, \alpha_6, \alpha_7\} \quad (4)$$

The read level may be set before each of N number of reads. A lookup table may be used to determine how many read levels, and the values for the read levels, based on how many bins are to be used in determining LLR values for the memory cells. A flash memory device may be instructed to read the LSB or MSB page using the stored read levels. As described previously, to create the bins, a first read level is used to determine a putative value of the cells and then multiple reads (e.g., a series of reads) are performed to determine associated LLR values. In some aspects, read levels are determined by varying the first read level by a predetermined (e.g., stored) offset associated with a respective bin. This offset may be different than the offsets that are determined by the subject technology.

Transitions in the read data are analyzed to determine which region contains the voltage threshold ($V_T$) of each memory cell. Accordingly, the first read level may be stored (e.g., temporarily), and a region determined based on a binary value read from the memory cell, and differences between the first read level and subsequent read levels initiated by a memory controller. The read levels may or may not be changed in a predetermined order. If the read levels are changed in a prescribed order, only the previous read level may be stored and the cell program region determined on each subsequent read. If all reads are performed (e.g., at once), a lookup table may be used to determine the bins based on the received binary values. Once determined, a bin number for each cell program region may be determined. The LLR assigned to the bin may be applied to all cells falling within the bin. For each memory cell, the bin number is mapped to a LLR value in a lookup table.

In accordance with the foregoing, for a primary read level (e.g., RL1, RL2, or RL3), the number of bins will be equal to the total number of reads, including soft reads, plus one. While FIGS. 2A and 2B depict three reads for each primary read level, more reads are possible. For a total of seven reads (including e.g., three soft reads on each side of a primary read), a table may be generated for the LLR values that includes 8 columns corresponding to the 8 bins. In this example an MSB page may have two rows, as shown in Table 2:

TABLE 2

|     | 0    | 1    | 2    | 3    | 4   | 5   | 6   | 7    |
|-----|------|------|------|------|-----|-----|-----|------|
| RL1 | −255 | −114 | −133 | −116 | −78 | −38 | 5   | 117  |
| RL3 | 174  | 154  | 127  | 91   | 50  | 7   | −38 | −133 |

The location of the primary read level with respect to table 2 is between bin 3 and bin 4. A table generated for LSB page may only require one row, as shown in Table 3:

TABLE 3

|     | 0    | 1    | 2    | 3    | 4   | 5   | 6  | 7   |
|-----|------|------|------|------|-----|-----|----|-----|
| RL2 | −255 | −199 | −163 | −119 | −70 | −23 | 24 | 110 |

As described previously, offsets (or bias values) may be implemented in connection with primary read levels (e.g., RL1, RL2, RL3) in order to obtain an optimal read level having a low bit error rate. Offset values may be set globally, e.g., for a die or block, or on an individual wordline basis. Each wordline may have different and/or unique characteristics that cause each wordline to exhibit greater or lesser errors during read operations. Accordingly, in order to obtain the best error rate—the minimum error rate—the optimum read level must be determined. In some aspects, optimal read levels for a wordline may be determined by lab data. In various examples described herein, the wordline may be read at different offsets and the error count for each read placed in a table for later comparison. While this lab data may be useful for a portion of the lifecycle of the memory, characteristics of memory cells change over time and the data may not be as useful in obtaining the best error rates after a period of time in the life cycle of the memory cells.

Different tables 400, e.g., may be stored in flash memory for each read level (e.g., RL1, RL2, or RL3) and for multiple different periods in the expected life of the flash memory so that a device may obtain near optimal bit error rates throughout the expected life of the device. However, the lab data may not apply to every die, every block, or even every form of degradation that may be experience by the individual wordlines or flash memory cells over the life of the device. Accordingly, the subject technology provides a mechanism for dynamically (e.g., at run time) calibrating read levels by estimating new read optimum read levels and/or offsets during operation of the flash memory device.

Figure 10A:
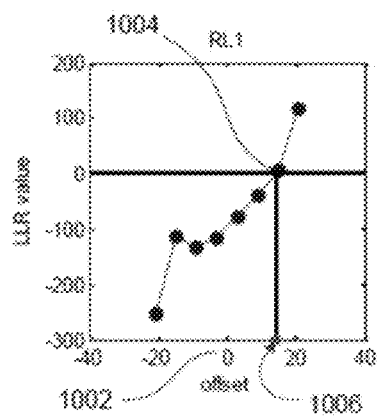
FIG. 10A to 10C depict example linear interpolation graphs for calibrating example read levels and/or read level offsets.
Figure 10B:
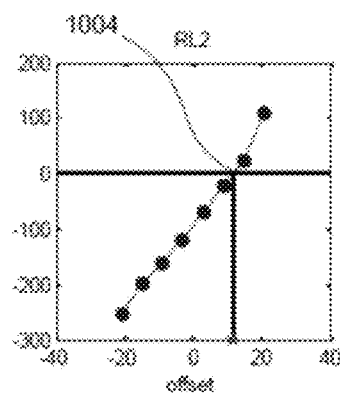
Figure 10C:
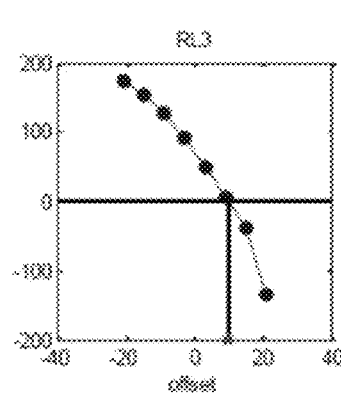

FIG. 10A to 10C depict example linear interpolation graphs for calibrating example read levels and/or read level offsets, according to various aspects of the subject technology. The graphs are representative of how an algorithm of the subject technology determines a new calibrated offset for read operations. With reference to tables 2 and 3, above, each graph charts a calculated LLR value with respect to predetermined offset values associated with each bin. Accordingly, the x-axis represents a range of negative and positive offset values from an un-calibrated, zero offset 1002. In the depicted example, un-calibrated offset 1002 (marked as "0") corresponds to the respective "center" read level (e.g., RL1, RL2, or RL3) used to initially determine the programmed level of a memory cells, before it is reread by the "supplemental" read levels used to generate the bins.

Each bin spans 6 ticks on the x axis, according to a fixed amount. In the depicted example, offsets are evenly spaced 6 ticks apart. Offsets 0 to +6 on the x-axis correspond to bin 4, offsets +7 to +12 correspond to bin 5, offsets +13 to +18 correspond to bin 6, and offsets +19 to +24 correspond to bin 7. Similarly, offsets 0 to −6 on the x-axis correspond to bin 3, offsets −7 to −12 correspond to bin 2, offsets −13 to −18 correspond to bin 2, and offsets −19 to −24 correspond to bin 0. The corresponding LLR values placed in the bins are charted at offset values −21, −15, −9, −3, +3, +9, +15, and +21, respectively. These offset values are merely provided as examples and other offset values may be used, according to the particular memory implementation.

Once the memory cells of a wordline or block are read, and LLRs determined, the subject technology assigns the LLRs to bins for each of RL1, RL2, and RL3 in a table, as shown in Tables 2 and 3, above. Linear interpolation of the LLR values across the corresponding bins (e.g., 0-7) is then used to determine a zero crossing point (1004) of the represented LLR values. The zero crossing point is an estimate of the point at which the conditional probability distributions associated with the threshold voltage of the cell are equal, and representative of the read level that minimizes the bit error rate. Interpolation increases the accuracy of the estimated zero crossing point without the need for additional reads.

In this regard, the LLR values in a row of the table are scanned to determine where the zero crossing point is. With regard to FIG. 10A and Table 1, above, the zero crossing point (1004) for RL1 is between bin 5 and bin 6, having LLR values −38 and 5, respectively. An offset value (1006) along the x-axis corresponding to the zero crossing point (1004) is selected as the calibrated offset value for the corresponding read level (e.g., RL1, RL2, or RL3). In FIG. 10A, the calibrated offset value is determined to be approximately +14 ticks (e.g., +175 mV, with every two ticks being 25 mV). In FIG. 10B, the calibrated offset value is determined to be approximately +12 ticks. In FIG. 10C, the calibrated offset value is determined to be approximately +10 ticks.

A calibrated offset value may be determined for each read level (e.g., RL1, RL2, or RL3), as indicated above. In some implementations, the calibrated offset values may replace or be used to adjust existing offset values for individual wordlines, or globally for a block or die(s). In some implementations, the calibrated offset voltage replaces a read level offset previously associated with an offset wordline group determined by, for example, processes 700 and/or 800. In some aspects, the previously associated read level offset will be adjusted by the calibrated voltage.

The calibrated offset voltages need not be determined for all memory cells of a block, die, or group but, rather, may be determined for one or more selected wordlines, portions of a wordline, one or more codewords, and the like. In some implementations, the calibrated offset values may be stored in addition to the offsets determined for a wordline group, and summed at the time of a read operation with the offset assigned to the wordline group and any global offset, if available.

Read levels may be calibrated using the above procedure at specific points in the expected lifetime of a flash device. For example, the calibration procedure may be executed when a block becomes subject to a predetermined number of program/erase cycles. The calibration procedure may be executed in a "heroic mode," e.g., in response to an error count produced in connection with a read operation satisfying a predetermined threshold number of errors. The predetermined threshold may be with respect to one or more codewords, wordlines, blocks or combination thereof, for a single read operation or for multiple read operations over a period of time. In some implementations, the predetermined threshold of errors may include the failure to read or decode one or more memory cells that are subject of the read operation. For example, the number of errors produced may be more than the ECC scheme associated with the flash memory device can handle.

In response to identifying a wordline associated with an overly high error count (satisfying the threshold), a flash controller or component thereof implementing the subject technology may read memory cells in one or more wordlines adjacent to the identified wordline to generate the LLR values for the respective bins, and determine a new calibrated offset value for the reading the wordlines using the foregoing LLR linear interpolation process. If the adjacent wordlines can be read and successfully decoded then the new calibrated offset value may be used in an attempt to recover a read of memory cells in the identified wordline. The identified wordline may then be re-read using the read level set to (e.g., adjusted by) the calibrated offset value.

Similarly, a codeword (e.g., spanning wordlines, or a portion of a wordline) subject to a read operation may be identified as having an error rate that satisfies an error threshold. For example, all attempts to decode the codeword may have failed. In response to identifying the codeword, the flash controller or component thereof implementing the subject technology may read memory cells in one or more other codewords adjacent to the identified codeword to generate the LLR values, and determine the new calibrated offset value using the foregoing LLR linear interpolation process. For example, current LLR values may not be optimized to decode the identified codeword. An adjacent codeword may then read to find an improved set of LLR values. If the adjacent codewords can be read and successfully decoded (and new LLR values generated) then the new calibrated offset value may be used in an attempt to recover the failed codeword. The identified codeword may then be re-read using the read level set to (e.g., adjusted by) the calibrated offset value.

TABLE 4

|  | 0 | 1 | 2 | 3 | 4 | 5 | 6 | 7 |
|---|---|---|---|---|---|---|---|---|
| RL1 | −255 | −108 | −71 | −25 | −22 | −70 | 111 | 146 |
| RL2 | −255 | −123 | −74 | −24 | −26 | −74 | 109 | 119 |
| RL3 | 191 | 112 | 70 | 23 | −26 | −74 | −117 | −165 |

Figure 10D:
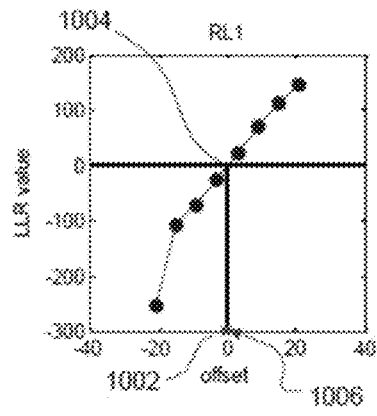
FIGS. 10D to 10F depict example linear interpolation graphs for re-calibrating example read levels and/or read level offsets.
Figure 10E:
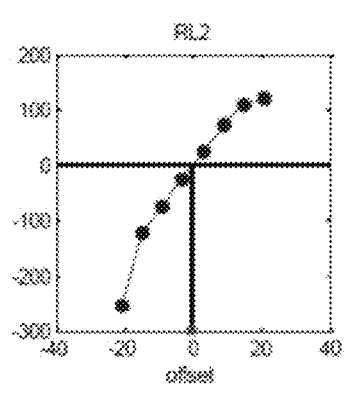
Figure 10F:
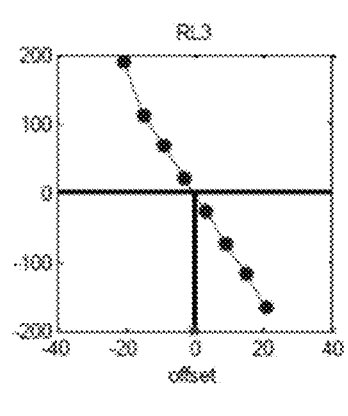

Table 4, above, is representative of updated LLR values for each bin, after calibration of the respective read level offsets corresponding to the LLR values of Tables 2 and 3. As may be seen by Table 4, the zero crossing point (1004) is now between bins 3 and 4 for all three read levels. FIGS. 10D to 10F depict example linear interpolation graphs for re-calibrating example read levels and/or read level offsets, according to various aspects of the subject technology. After the read levels have been adjusted according to the process described above with respect to FIGS. 10A to 10C, the adjusted read level(s) may then be recalibrated to verify or finetune the calibration, using the same process. The resulting LLR values are expected to eventually converge to a zero offset, as shown by Table 4 and the graphs of FIGS. 10D to 10F.

Figure 11A:
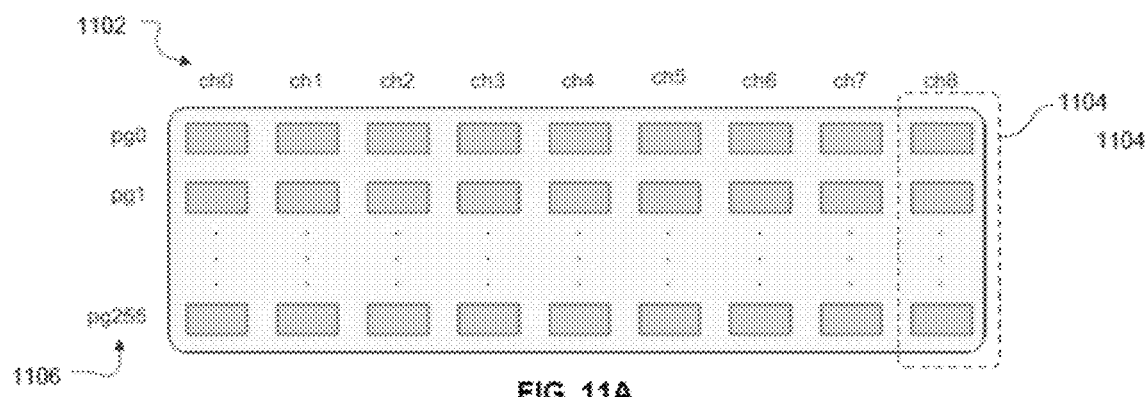
FIGS. 11A and 11B depict example read level optimization modes.
Figure 11B:
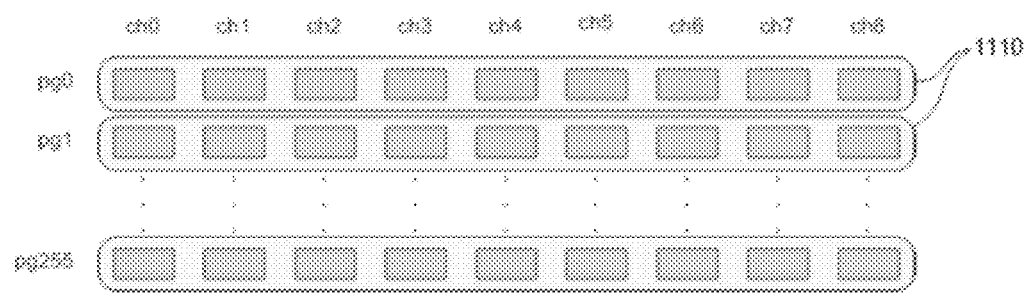

FIGS. 11A and 11B depict example read level optimization modes, according to various aspects of the subject technology. Flash memory architecture may be configured such that data is stored and retrieved via multiple channels 1102 of memory, with each channel 1102, e.g., including one or more memory blocks 1104. Each memory block 1104 addressable by each channel 1102 is further addressable by page addresses 1106. In the depicted examples, each channel addresses a single memory block, with each memory block having 256 pages (e.g., pages 0-255). As described previously, a page 1106 may be physically represented by a wordline and thus the term page and wordline may be used interchangeably.

In some implementations, as depicted by FIG. 11A, an offset voltage may be assigned globally, e.g., to all blocks and all pages addressable by the memory channels. In this implementation, the same offset value is a "global" offset used when reading memory cells of any page or block associated with the plurality of memory channels. Accordingly, the global offset may be calibrated using any of the techniques described herein. In some implementations, as depicted by FIG. 11B, multiple offsets may be used, with each offset value being associated with each page (wordline), e.g., by associating each offset value with a page address 1106. Associations 1110 may be generated between offset values and page such that the same offset value is used for each page across all of the memory channels. These "page offsets" may be relative to global offsets, in that a global offset will be applied (and adjusted as needed) to all pages, and the global offsets will be modified by the corresponding page offsets as each page is read.

Figure 12:
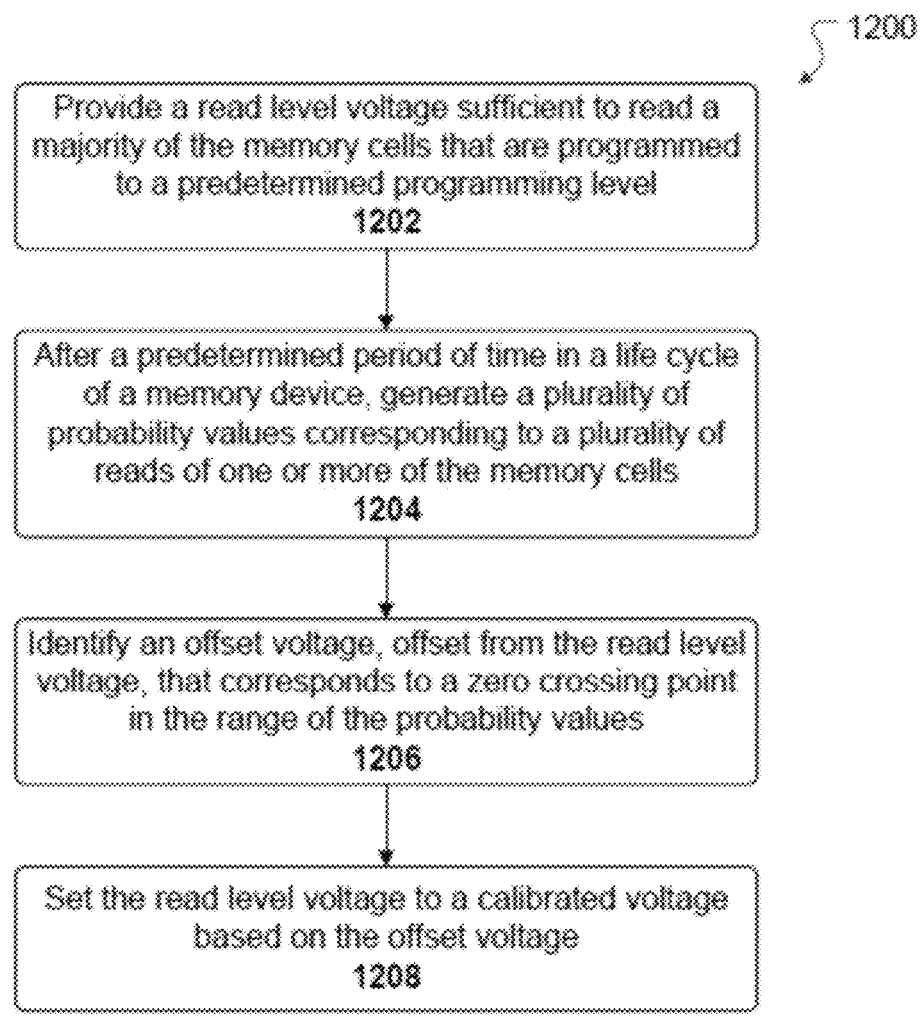
FIG. 12 depicts a flow diagram of an example process for calibrating read levels for reading a plurality of memory cells in a storage device.

FIG. 12 depicts a flow diagram of an example process 1200 for calibrating read levels for reading a plurality of memory cells in a storage device, according to various aspects of the subject technology. For explanatory purposes, the various blocks of example process 1200 are described herein with reference to the components and/or processes described herein. The one or more of the blocks of process 1200 may be implemented, for example, by one or more processors, including, for example, flash memory controller 1501 of FIG. 15 or one or more components or processors of controller 1501. In some implementations, one or more of the blocks may be implemented apart from other blocks, and by one or more different processors or controllers. Further for explanatory purposes, the blocks of example process 1200 are described as occurring in serial, or linearly. However, multiple blocks of example process 1200 may occur in parallel. In addition, the blocks of example process 1200 need not be performed in the order shown and/or one or more of the blocks of example process 1200 need not be performed.

According to various implementations, the blocks of process 1200 correspond to, or supplement the process described with respect to FIG. 9 and FIGS. 10A to 10F. The blocks of process 1200, or subset thereof, may be executed for each possible read level used in a flash memory device. For example, the blocks of process 1200 may be executed to generate, adjust, and/or calibrate offsets for wordlines or wordline groups for RL1, RL2, and RL3. In various aspects, offset wordline groups of different sizes and/or having different offset value pairings may be generated for each different read level. Additionally, the blocks of process 1200 may be executed to generate, adjust, and/or calibrate offsets for different groups for different blocks, and or die. Process 1200 may be implemented during configuration of a storage device, prior to or during operation.

In the depicted example, a flash memory device provides a read level voltage sufficient to read memory cells that are programmed to a programming level (1202). For example, the read level voltage may be pre-programmed into a state machine of flash memory device by the manufacturer or the storage device controller. As described previously, the memory cells may be a single level or multi-level non-volatile memory cells configured to be programmed to one of four programming levels. For example, with reference to FIG. 2B, L0 and L3 programming levels may be associated with first bit values (e.g., representative of a binary 0 or 1 of a most significant bit) and L1 and L2 programming levels may be associated with the second bit values (e.g., representative of a binary 0 or 1 of a least significant bit). As described previously, when voltage is applied to a memory cell at a particular read level (e.g., RL1, RL2, RL3) corresponding to the program level of the cell the cell will conduct indicating the program level.

After a predetermined period of time in a life cycle of the flash memory device (e.g., after 30,000 program/erase cycles), reliability values corresponding to a plurality of reads of one or more of the memory cells are generated (1204). In this example, each of the reads uses a variation of the read level voltage, and each generated reliability value is indicative of a likelihood that an output state of the memory cells is equal to a one of multiple predetermined programmed states, with a range of the reliability values spanning negative and positive values. As described previously, for the plurality of reliability values, a positive reliability value may be indicative of a corresponding output state being a binary 0, and a negative reliability value may be indicative of the corresponding output state being a binary 1.

After the reliability values are generated, an offset voltage is identified, offset from the read level voltage (1206). In the depicted examples of FIGS. 10A to 10C, the offset corresponds to a zero crossing point 1004 in the range of the reliability values (e.g., of Tables 2 and/or 3).

After the offset voltage is identified (e.g., for the read level) the read level voltage is set to a calibrated voltage based on the offset voltage (1208). According to various aspects of the subject technology, setting the read level voltage to the calibrated voltage may include, e.g., in connection with a read operation, retrieving the identified offset voltage from a stored location, and adjusting the read level voltage by the identified offset voltage to read the memory cells. In some implementations, the read operation is performed on memory cells across a plurality of memory channels, each channel being configured to address one or more memory blocks.

With reference to FIG. 11A, the identified offset voltage may be associated with all blocks and all pages addressable by the plurality of memory channels so that the read level is adjusted by the identified offset voltage when reading memory cells of any page or block associated with the plurality of memory channels. With reference to FIG. 11B, the identified offset voltage may be associated with a page address, and the read level adjusted by the identified offset voltage when reading memory cells associated with the page address via any of the plurality of memory channels, with each page address addressable via the plurality of memory channels being associated with a different offset voltage.

Additionally, the process of calibration may be applied to update offsets for individual wordlines or to update offsets associated with optimal wordline groups. For example, a plurality of predetermined read level offsets may be stored, with each predetermined read level offset being associated with a group of wordlines for use with a respective read level voltage in reading memory cells in the group. For a respective group of wordlines, the read level offset previously associated with the group may be updated with the identified offset voltage. Accordingly, in connection with a read operation, the updated read level offset may be retrieved from its stored location (e.g., a lookup table) to set the read level voltage to the calibrated voltage, and the newly calibrated voltage used to read the respective group of wordlines.

Figure 13:
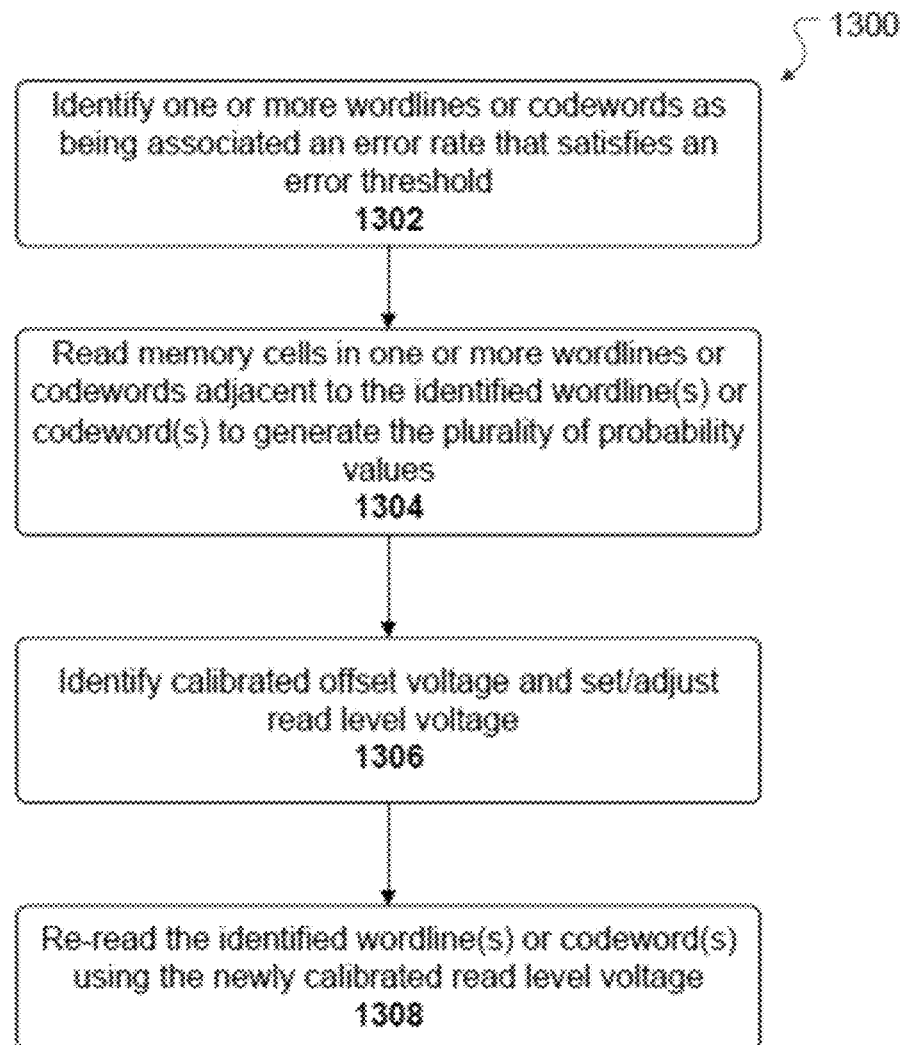
FIG. 13 depicts a flow diagram of an example process for calibrating read levels to recover data.

FIG. 13 depicts a flow diagram of an example process 1300 for calibrating read levels to recover data, according to various aspects of the subject technology. The foregoing calibration process 1200 may further be applied to recover data that cannot be read or decoded. In the depicted example implementation of FIG. 13, during a read operation, one or more wordlines or codewords are identified as being associated an error rate that satisfies (e.g., exceeds) an error threshold (1302). For example, reading a wordline or codeword may produce too many data errors for the error correction coding to handle. In this regard, the read operation may not be able to read the data stored at the one or more identified wordlines.

In response to identifying the wordline(s) or codeword(s), process 1200 of FIG. 12, or one or more blocks thereof, may be invoked to recover data from the one or more wordlines. In this regard, memory cells in one or more wordlines or codewords adjacent to the identified wordline(s) or codeword(s) are read to generate the plurality of reliability values described above with respect to FIGS. 10A to 10C (1304). After the reliability values are generated, the new calibrated offset voltage is identified (e.g., that corresponds to a zero crossing point 1004 in the range of the reliability values) and the read level voltage is set/adjusted to the new calibrated offset voltage (1306). The identified wordline(s) or codeword(s) are then re-read using the newly calibrated read level voltage (1308).

Regenerating Read Level Offset Groups

Figure 14:
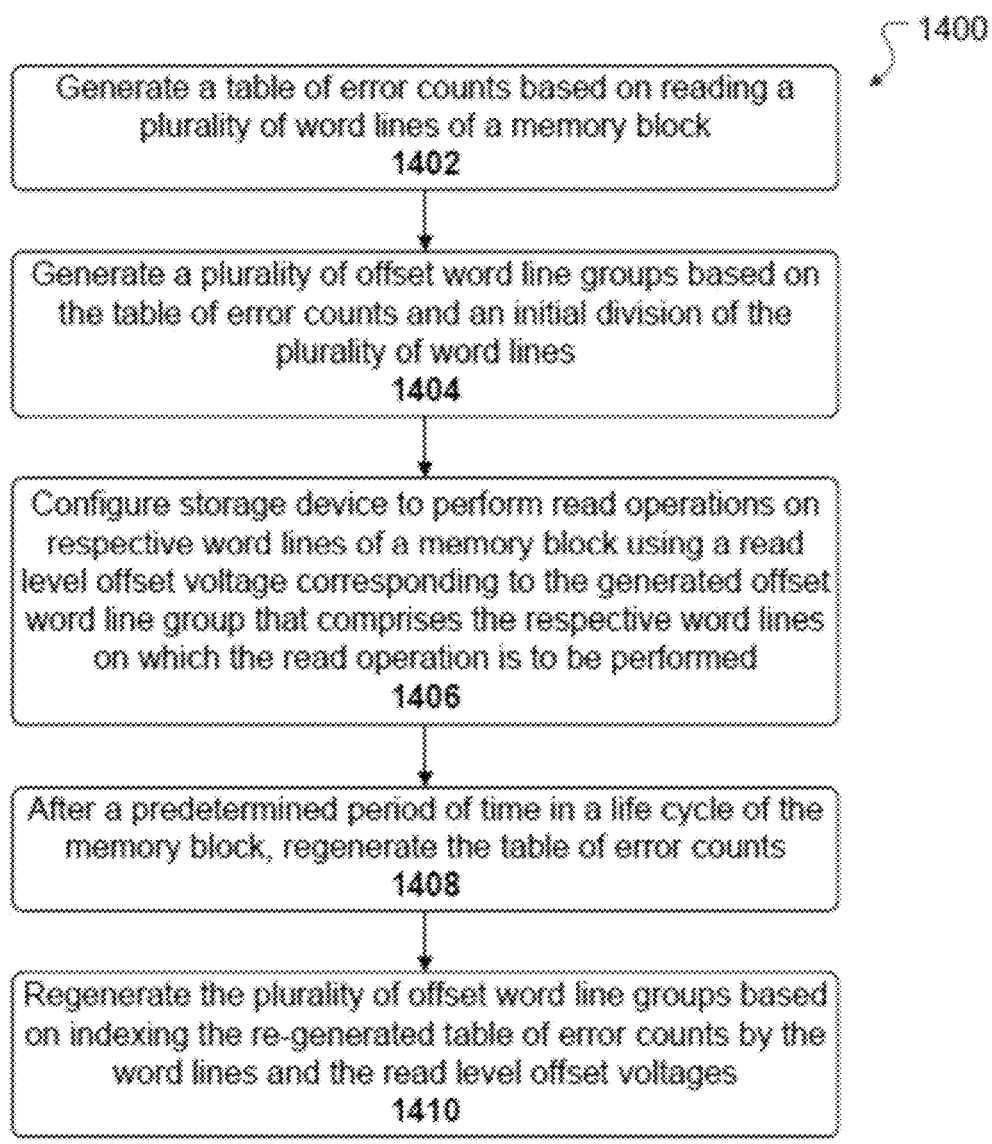
FIG. 14 depicts a flow diagram of an example process for regenerating a plurality of optimal offset wordline groups based on regenerating and reindexing a table of error counts.

FIG. 14 depicts a flow diagram of an example process 1400 for regenerating a plurality of optimal offset wordline groups based on regenerating and reindexing a table of error counts, according to various aspects of the subject technology. For explanatory purposes, the various blocks of example process 1400 are described herein with reference to the components and/or processes described herein. One or more of the blocks of process 1400 may be implemented, for example, by one or more processors, including, for example, flash memory controller 1501 of FIG. 15 or one or more components or processors of controller 1501. In some implementations, one or more of the blocks may be implemented apart from other blocks, and by one or more different processors or controllers. Further for explanatory purposes, the blocks of example process 1400 are described as occurring in serial, or linearly. However, multiple blocks of example process 1400 may occur in parallel. In addition, the blocks of example process 1400 need not be performed in the order shown and/or one or more of the blocks of example process 1400 need not be performed.

According to various implementations, one or more blocks of process 1400 may correspond to, or supplement one or more blocks of processes 700, 800, 1300, and/or 1200, and/or the processes described with respect to FIG. 9 and FIGS. 10A to 10F. For example, block 1402 may generate the table of error counts used in block 712. Block 1404 may correspond to the block 804 and/or blocks 708-720. The blocks of process 1400, or subset thereof, may be executed for each possible read level used to read memory cells in a flash memory device. These memory cells are configured to be programmed to a plurality of programming levels, each programming level being determined by reading the memory cells at a respective read level voltage. The blocks of process 1400 may be executed to generate, adjust, and/or calibrate offsets for wordlines or wordline groups for RL1, RL2, and RL3. A portion of the blocks of process 1400 may be executed by algorithm 602. In various aspects, offset wordline groups of different sizes and/or having different offset value pairings may be generated for each different read level. Additionally, the blocks of process 1400 may be executed to generate, adjust, and/or calibrate offsets for different groups for different blocks, and or die. Process 1400 may be implemented during configuration of a data storage system, prior to or during operation.

In the depicted example, a system according to the subject technology generates a table of error counts based on reading a plurality of wordlines of a memory block (1402). Table 400 is one example of a table of error counts that may be generated by the subject technology. As described previously, to generate a new table, each wordline may be read multiple times using a read level voltage modified by a different offset voltage. Each read may produce an error count for each offset voltage. The table is generated such that the rows of the table correspond to wordlines and the columns correspond to offset values. The error counts that are generated may then be indexed by wordline and respective offset voltages.

In connection with configuring a storage device implementing the subject technology, a plurality of optimal offset wordline groups are generated (e.g., by algorithm 602) based on the table of error counts and an initial division of the plurality of wordlines (1404). As described previously with respect to processes 700 and 800 and FIGS. 7 and 8, each optimal offset wordline group may include a consecutively grouped portion of the wordlines paired with a corresponding offset voltage, the pairings selected for an overall lowest possible error count for reading wordlines in each of the offset wordline groups. In this regard, a table of error counts may be indexed by respective wordlines and read level offset voltages to determine the maximum and/or minimum error counts possible for each of the wordlines. The wordlines may then be organized into consecutive groups, with each group paired with an offset value that provides the lowest overall possible error count degradation for the groupings as compared to using offset values for each individual wordline.

After the optimal wordline groups (including corresponding offset voltages) are generated, the storage device is configured to perform read operations on respective wordlines of a memory block using a read level offset voltage corresponding to the generated offset wordline group that includes the respective wordlines (1406). Accordingly, in connection with reading memory cells of a particular wordline of an offset wordline group, the offset voltage associated with the respective offset wordline group may be identified and the memory cells read using the identified offset voltage. In various implementations, the identified offset voltage modifies the respective read level voltage to read the memory cells with fewer errors than if the respective read level voltage was not modified.

After a predetermined period of time in a life cycle of the memory block (e.g., after memory cells in the memory block having undergone 30,000 program/erase cycles), the optimal wordline groups, including their associated offset values, may be recalibrated. In this regard, the table of error counts is regenerated (1408). The table of error counts may be re-generated, for example, based on re-reading the plurality of wordlines of a memory block, for example, under current conditions (e.g., voltage levels) of the flash memory device.

In some implementations, before the table of error counts is regenerated, the read levels and/or offset voltages used to generate the table may be calibrated. With brief reference to FIG. 13 and process 1300, reliability values corresponding to multiple reads about a respective read level voltage may be generated, an updated offset voltage for the read level voltage identified, and the storage device configured to re-read the plurality of wordlines of the memory block using the updated offset voltage in connection with the read level voltage. Accordingly, each of the reads may use a variation of the read level voltage, and each generated reliability value may be indicative of a likelihood that an output state of the memory cells is equal to a predetermined programmed state (e.g., log-likelihood ratio). A range of the reliability values may span negative and positive values. The identified updated offset voltage used to re-read the wordlines may correspond to a zero crossing point in the range of the reliability values.

Once the table of error counts is regenerated, the optimal offset wordline groups are regenerated based on indexing the re-generated table of error counts by the wordlines and the read level offset voltages (1410). The optimal offset wordline groups may be regenerated in the manner described by one or more blocks of process 700 and/or process 800.

Many of the above-described features of example processes 1200, 1300, and 1400 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

Figure 15:
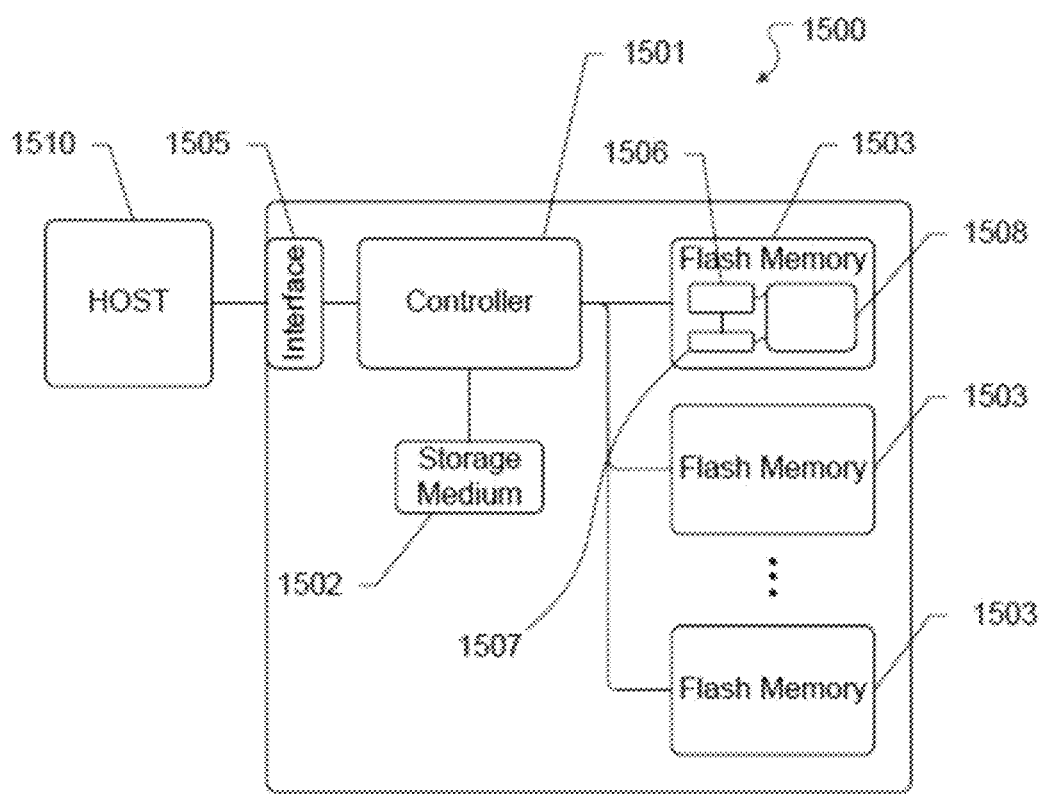
FIG. 15 is a block diagram depicting components of an example data storage system.

FIG. 15 is a block diagram depicting components of an example data storage system 1500 (for example, a solid state drive) according to various implementations of the subject technology. Data storage system 1500 may include a data storage controller 1501, storage medium 1502, and flash memory device 1503. Controller 1501 may use storage medium 1502 for temporary storage of data and information used to manage data storage system 1500. Controller 1501 may include several internal components (not shown) such as one or more processors, a read-only memory, a flash component interface (for example, a multiplexer to manage instruction and data transport along a serial connection to flash memory device 1503), an I/O interface, error correction circuitry, and the like. In some aspects, one or more elements of controller 1501 may be integrated into a single chip. In other aspects, the elements may be implemented on two or more discrete components.

Controller 1501, or one or more components therein, may be configured to execute code or instructions to perform the operations and functionality described herein. For example, controller 1501 may be configured to perform operations for managing request flow and address mappings, and to perform calculations and generate commands. The processor of controller 1501 may be to monitor and control the operation of the components in data storage controller 1501. The processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. One or more sequences of instructions may be stored as firmware on ROM within controller 1501 and/or its processor. One or more sequences of instructions may be software stored and read from storage medium 1502, flash memory device 1503, or received from host device 1510 (for example, via a host interface). ROM, storage medium 1502, flash memory device 1503, represent examples of machine or computer readable media on which instructions/code executable by controller 1501 and/or its processor may be stored. Machine or computer readable media may generally refer to any tangible and/or non-transitory medium or media used to provide instructions to controller 1501 and/or its processor, including both volatile media, such as dynamic memory used for storage media 1502 or for buffers within controller 1501, and non-volatile media, such as electronic media, optical media, and magnetic media.

Accordingly, data storage system 1500 may further include a host interface 1505. Host interface 1505 is configured to be coupled to host device 1510, to receive data from and send data to host device 1510. Host interface 1505 may include both electrical and physical connections for operably coupling host device 1510 to controller 1501. Host interface 1505 is configured to communicate data, addresses, and control signals between host device 1510 and controller 1501. In this manner, controller 1501 is configured to store data received from host device 1510 in flash memory device 1503 in response to a write command from host device 1510, and to read data stored in flash memory device 1503 and to transfer the read data to host device 1510 via host interface 1505 in response to a read command from host device 1510.

Host device 1510 represents any device configured to be coupled to data storage system 1500 and to store data in data storage system 1500. Host device 1510 may be a computing system such as a personal computer, a server, a workstation, a laptop computer, PDA, smart phone, and the like. Alternatively, host device 1510 may be an electronic device such as a digital camera, a digital audio player, a digital video recorder, and the like.

In some aspects, storage medium 1502 represents volatile memory used to temporarily store data and information used to manage data storage system 1500. According to one aspect of the present disclosure, storage medium 1502 is random access memory (RAM) such as double data rate (DDR) RAM. Other types of RAM also may be used to implement storage medium 1502. Storage medium 1502 may be implemented using a single RAM module or multiple RAM modules. While storage medium 1502 is depicted as being distinct from controller 1501, those skilled in the art will recognize that storage medium 1502 may be incorporated into controller 1501 without departing from the scope of the present disclosure. Alternatively, storage medium 1502 may be a non-volatile memory such as a magnetic disk, flash memory, peripheral SSD, and the like.

As further depicted in FIG. 2, data storage system 1500 may also include a bus. The bus may use suitable interfaces standard including, but not limited to, Serial Advanced Technology Attachment (SATA), Advanced Technology Attachment (ATA), Small Computer System Interface (SCSI), PCI-extended (PCI-X), Fibre Channel, Serial Attached SCSI (SAS), Secure Digital (SD), Embedded Multi-Media Card (EMMC), Universal Flash Storage (UFS) and Peripheral Component Interconnect Express (PCIe).

Host device 1510 and data storage system 1500 may be in communication with each other via a wired or wireless connection and may be local to or remote from one another. According to some aspects, data storage system 1500 may include pins (or a socket) to mate with a corresponding socket (or pins) on host device 1510 to establish an electrical and physical connection. According to one or more other aspects, data storage system 1500 includes a wireless transceiver to place host device 1510 and data storage system 1500 in wireless communication with each other.

Flash memory device 1503 represents a non-volatile memory device for storing data. According to one aspect of the present disclosure, flash memory device 1503 includes, for example, a NAND flash memory. Flash memory device 1503 may include a single flash memory device or chip, and may include multiple flash memory devices or chips arranged in multiple channels. Flash memory device 1503 is not limited to any particular capacity or configuration. For example, the number of physical blocks, the number of physical pages per physical block, the number of sectors per physical page, and the size of the sectors may vary within the scope of the present disclosure.

Flash memory may have a standard interface specification. This standard ensures that chips from multiple manufacturers may be used interchangeably (at least to a large degree). The interface may further hide the inner working of the flash memory and return only internally detected bit values for data.

The term "software" is meant to include, where appropriate, firmware residing in read-only memory or applications stored in magnetic storage, which can be read into memory for processing by a processor. Also, in some implementations, multiple software aspects of the subject disclosure can be implemented as sub-parts of a larger program while remaining distinct software aspects of the subject disclosure. In some implementations, multiple software aspects can also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader).

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "embodiment" does not imply that such embodiment is essential to the present disclosure or that such embodiment applies to all configurations of the present disclosure. A disclosure relating to an implementation may apply to all aspects, or one or more aspects. An implementation may provide one or more examples. A phrase such as an "embodiment" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A machine-implemented method, the method comprising:
   dividing a plurality of flash memory wordlines of a flash storage device into a plurality of wordline groups based on read error counts associated with the wordlines and a plurality of read level offsets;
   associating each wordline group with one of the plurality of read level offsets determined while dividing the plurality of flash memory wordlines; and
   storing associations between the plurality of read level offsets and the plurality of wordline groups for use in connection with read levels to read the flash memory wordlines of the respective wordline groups.

2. The machine-implemented method of claim 1, wherein each of the plurality of wordline groups comprises consecutively ordered wordlines of a flash memory block.

3. The machine-implemented method of claim 1, wherein dividing the plurality of flash memory wordlines into the plurality of wordline groups comprises:
   selecting respective permutations of consecutive wordline subgroups from within a predetermined set of wordline candidate groups based on a minimum of total error counts associated with the respective permutations, the consecutive wordline subgroups each being associated with a read level offset corresponding to a minimum of error counts associated with a plurality of possible read level offsets.

4. The machine-implemented method of claim 3, wherein dividing the plurality of flash memory wordlines into the plurality of wordline groups comprises:
   (a) selecting first and second consecutive candidate wordline groups from the predetermined set of candidate wordline groups;
   (b) providing a plurality of subgroup permutations for the selected first and second consecutive candidate wordline groups, each subgroup permutation comprising multiple consecutive wordline subgroups of wordlines spanning the first and second consecutive wordline groups;
   (c) for each wordline subgroup of a respective subgroup permutation, identifying from the plurality of possible read level offsets a respective read level offset that when used with the read level to read the wordlines in the wordline subgroup generates the least number of errors for the wordline subgroup; and
   (d) choosing one of the plurality of subgroup permutations having a lowest total error count for consecutive wordline subgroups in the subgroup permutation based on the identified read level offsets for the consecutive wordline subgroups, wherein the plurality of wordline groups are based at least in part on one or more read level offsets corresponding to the selected one of the plurality of subgroup permutations.

5. The machine-implemented method of claim 4, wherein dividing the plurality of flash memory wordlines into the plurality of wordline groups further comprises:
- (e) storing an association between a first of the consecutive wordline subgroups in the chosen subgroup permutation and a corresponding identified read level offset; and
- (f) repeating steps (a) through (e) using a second of the consecutive wordline subgroups in the chosen subgroup permutation as the first consecutive candidate wordline group and a next candidate group from the predetermined set of candidate wordline groups as the second consecutive candidate wordline group, the repeating ending when associations have been stored for all wordlines in the predetermined set of candidate wordline groups.

6. The machine-implemented method of claim 5, wherein dividing the plurality of flash memory wordlines into the plurality of wordline groups further comprises:
repeating steps (a) through (f) until wordline boundaries of the consecutive wordline subgroups do not change from one iteration to a next iteration, or until an overall bit error rate measured based on identified read level offsets for the consecutive wordline subgroups does not change from one iteration to a next iteration, or a certain number of iterations is reached.

7. The machine-implemented method of claim 3, wherein each consecutive wordline subgroup of a respective permutation is generated based on an interleaving of consecutive wordlines within the predetermined set of candidate wordline groups.

8. The machine-implemented method of claim 1, wherein dividing the plurality of flash memory wordlines into the plurality of wordline groups comprises:
selecting respective permutations of consecutive wordline subgroups from within a predetermined set of candidate groups based on selecting a minimum of maximum error counts associated with the respective permutations, the consecutive wordline subgroups each being associated with a read level offset corresponding to a minimum of respective error counts associated with a plurality of possible read level offsets.

9. The machine-implemented method of claim 8, wherein dividing the plurality of flash memory wordlines into the plurality of wordline groups comprises:
- (a) selecting first and second consecutive candidate wordline groups from the predetermined set of candidate groups;
- (b) providing a plurality of subgroup permutations for the selected first and second consecutive candidate wordline groups, each subgroup permutation comprising multiple consecutive wordline subgroups of wordlines spanning the first and second consecutive wordline groups;
- (c) for each consecutive wordline subgroup of a respective subgroup permutation, determining a maximum error count associated with reading wordlines in the wordline subgroup for each possible read level offset used with the read level to read the wordlines of the wordline subgroup, and selecting from the plurality of possible read level offsets a read level offset corresponding to the minimum of the determined maximum error counts for the wordline subgroup;
- (d) for each subgroup permutation, determining a maximum error count of the error counts associated with the wordline subgroups of the subgroup permutation; and
- (e) choosing one of the plurality of subgroup permutations having a minimum of the determined maximum error counts.

10. The machine-implemented method of claim 9, wherein dividing the plurality of flash memory wordlines into the plurality of wordline groups further comprises:
- (f) storing an association between a first of the consecutive wordline subgroups in the chosen subgroup permutation and a corresponding identified read level offset; and
- (g) repeating steps (a) through (f) using a second of the consecutive wordline subgroups in the chosen subgroup permutation as the first consecutive candidate wordline group and a next candidate group from the predetermined set of candidate groups as the second consecutive candidate wordline group, the repeating ending when associations have been stored for all wordlines in the predetermined set of candidate groups.

11. The machine-implemented method of claim 10, wherein dividing the plurality of flash memory wordlines into the plurality of wordline groups further comprises:
repeating steps (a) through (g) until wordline boundaries of the consecutive wordline subgroups do not change from one iteration to a next iteration, or until an overall bit error rate measured for the consecutive wordline subgroups does not change from one iteration to a next iteration, or a certain number of iterations is reached.

12. The machine-implemented method of claim 3, further comprising:
generating an error count table, each error count in the table being indexed based on a respective read level offset and a respective flash memory wordline; and
generating a respective normalized read level offset group based on: indexing the error count table by a plurality of consecutive flash memory wordlines to identify corresponding read level offsets having a lowest error count for each consecutive flash memory wordline, and determining a group of the consecutive flash memory wordlines that when associated with a single identified offset have a minimum possible error count for the group of the consecutive flash memory wordlines.

13. The machine-implemented method of claim 1, wherein the read level is a voltage to read flash memory cells that are programmed to a programming level.

14. The machine-implemented method of claim 2, wherein each memory cell of the flash memory block is configured to be programmed to one of a plurality of possible programming levels, with each level capable of being determined by a respective read level, and wherein a respective plurality of wordline groups is generated and stored for each respective read level.

15. The machine-implemented method of claim 1, wherein each read level offset is a voltage bias that, when summed with a corresponding read level, reduces an amount of errors produced from a read operation performed on a group of flash memory cells.

16. The machine-implemented method of claim 1, wherein each flash memory wordline comprises flash memory cells programmed with one or more pages of data.

17. The machine-implemented method of claim 1, further comprising:
configuring the storage device to retrieve a read level offset for a read operation based on a respective read level being used in the read operation and an address of a wordline that is a subject of the read operation being associated with a flash memory wordline group associated with the read level offset.

18. The machine-implemented method of claim 1, wherein the plurality of read level offsets are stored by the storage device in a lookup table.

19. A machine-implemented method, comprising:
dividing a plurality of flash memory wordlines into a plurality of wordline group offset pairs, each pair comprising an offset value for a group of consecutive wordlines in a flash memory block; and
storing the plurality of wordline group offset pairs, including the corresponding offset values, for use in connection with a read level in reading memory cells associated with the flash memory block during operation of a storage device.

20. The machine-implemented method of claim 19, wherein dividing the plurality of wordlines comprises:
selecting respective permutations of consecutive wordline subgroups from within a predetermined set of wordline candidate groups based on a minimum of total error counts associated with the respective permutations, the consecutive wordline subgroups each being associated with a read level offset corresponding to a minimum of error counts associated with a plurality of possible read level offsets.

21. The machine-implemented method of claim 19, wherein dividing the plurality of wordlines comprises:
selecting respective permutations of consecutive wordline subgroups from within a predetermined set of candidate groups based on selecting a minimum of maximum error counts associated with the respective permutations, the consecutive wordline subgroups each being associated with a read level offset corresponding to a minimum of maximum error counts associated with a plurality of possible read level offsets.

22. A data storage system, comprising:
a plurality of flash memory devices, each flash memory device comprising a plurality of flash memory blocks; and
a controller coupled to the plurality of flash memory devices, wherein the controller is configured to:
store a plurality of wordline group offset pairs for use in connection with a read level voltage in reading flash memory cells during a read operation, the wordline group offset pairs being formed from a division of a plurality of flash memory wordlines, wherein each stored pair comprises an offset value for a corresponding group of consecutive wordlines in a flash memory block.

23. The data storage system of claim 22, wherein each of the offset values represents a voltage bias that, when summed with a corresponding read level voltage, reduces an amount of errors produced from the read operation.

24. The data storage system of claim 22, wherein the wordline group offset pairs are stored in a lookup table.

* * * * *